US012588482B2

(12) United States Patent
Hu et al.

(10) Patent No.: US 12,588,482 B2
(45) Date of Patent: Mar. 24, 2026

(54) METHOD FOR FORMING SEMICONDUCTOR REDISTRIBUTION STRUCTURES

(71) Applicant: Taiwan Semiconductor Manufacturing Co., Ltd., Hsinchu (TW)

(72) Inventors: Chih-Chia Hu, Taipei (TW); Yu-Hsiung Wang, Zhubei City (TW); Ming-Fa Chen, Taichung City (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 551 days.

(21) Appl. No.: 17/663,328

(22) Filed: May 13, 2022

(65) Prior Publication Data

US 2023/0260941 A1      Aug. 17, 2023

Related U.S. Application Data

(60) Provisional application No. 63/267,949, filed on Feb. 14, 2022.

(51) Int. Cl.
*H01L 23/00* (2006.01)
*H01L 21/768* (2006.01)
(Continued)

(52) U.S. Cl.
CPC ........ *H01L 24/08* (2013.01); *H01L 21/76807* (2013.01); *H01L 21/76816* (2013.01);
(Continued)

(58) Field of Classification Search
CPC ....... H01L 2224/0231–02321; H01L 23/5226; H01L 21/76877–76883;
(Continued)

(56) References Cited

U.S. PATENT DOCUMENTS

| | | |
|---|---|---|
| 9,437,564 B2 | 9/2016 | Lu et al. |
| 11,217,552 B2 | 1/2022 | Chen et al. |

(Continued)

FOREIGN PATENT DOCUMENTS

| | | |
|---|---|---|
| CN | 110534507 A | 12/2019 |
| CN | 113594045 A | 11/2021 |

(Continued)

*Primary Examiner* — Scott B Geyer
(74) *Attorney, Agent, or Firm* — Slater Matsil, LLP

(57) ABSTRACT

An embodiment is a method including forming a first interconnect structure over a first substrate, forming a redistribution via over the first interconnect structure, the redistribution via being electrically coupled to at least one of the metallization patterns of the first interconnect structure, forming a redistribution pad over the redistribution via, the redistribution pad being electrically coupled to the redistribution via, forming a first dielectric layer over the redistribution pad, and forming a second dielectric layer over the first dielectric layer. The method also includes patterning the first and second dielectric layers, forming a bond via over the redistribution pad and in the first dielectric layer, the bonding via being electrically coupled to the redistribution pad, the bond via overlapping the redistribution via, and forming a first bond pad over the bonding via and in the second dielectric layer, the first bond pad being electrically coupled to the bond via.

20 Claims, 22 Drawing Sheets

(51) Int. Cl.
　H01L 23/522　　　　(2006.01)
　H01L 23/528　　　　(2006.01)

(52) U.S. Cl.
　CPC .... H01L 21/7684 (2013.01); H01L 21/76898
　　(2013.01); H01L 23/5226 (2013.01); H01L
　　23/5283 (2013.01); H01L 24/03 (2013.01);
　　H01L 24/05 (2013.01); H01L 24/80 (2013.01);
　　*H01L 24/19* (2013.01); *H01L 24/20* (2013.01);
　　*H01L 2224/02313* (2013.01); *H01L*
　　*2224/02331* (2013.01); *H01L 2224/02372*
　　(2013.01); *H01L 2224/02381* (2013.01); *H01L*
　　*2224/0362* (2013.01); *H01L 2224/03622*
　　(2013.01); *H01L 2224/05006* (2013.01); *H01L*
　　*2224/05008* (2013.01); *H01L 2224/05082*
　　(2013.01); *H01L 2224/05546* (2013.01); *H01L*
　　*2224/05573* (2013.01); *H01L 2224/05647*
　　(2013.01); *H01L 2224/08237* (2013.01); *H01L*
　　*2224/211* (2013.01); *H01L 2224/214*
　　(2013.01); *H01L 2224/80895* (2013.01); *H01L*
　　*2224/80896* (2013.01)

(58) Field of Classification Search
　CPC . H01L 2224/05009; H01L 2224/05025; H01L
　　2224/05087; H01L 2224/0509; H01L
　　2224/0557; H01L 2224/08146; H01L
　　2224/02372; H01L 23/5329–53295; H01L
　　21/76801–76837; H01L
　　2224/0237–02381; H01L 2224/0236;
　　H01L 2224/0235–02351; H01L
　　2224/0233–02335
　See application file for complete search history.

(56)　　　　　　References Cited

U.S. PATENT DOCUMENTS

| 11,658,069 B2 | 5/2023 | Chen et al. |
| 11,705,449 B2 | 7/2023 | Thei |

| 11,823,989 B2 | 11/2023 | Chen et al. | |
| 12,322,703 B2 | 6/2025 | Yeh | |
| 2009/0160051 A1* | 6/2009 | Lee | H01L 21/76898 |
| | | | 257/E21.597 |
| 2013/0113096 A1* | 5/2013 | Okumura | H01L 23/3114 |
| | | | 257/737 |
| 2015/0171006 A1* | 6/2015 | Hung | H01L 24/19 |
| | | | 257/774 |
| 2016/0218090 A1* | 7/2016 | Yu | H01L 25/065 |
| 2016/0343695 A1* | 11/2016 | Lin | H01L 23/528 |
| 2017/0125347 A1* | 5/2017 | Hu | H01L 25/50 |
| 2017/0373027 A1* | 12/2017 | Han | H01L 24/19 |
| 2018/0233425 A1* | 8/2018 | Yu | H01L 21/6835 |
| 2018/0294241 A1 | 10/2018 | Chen | |
| 2019/0131235 A1* | 5/2019 | Wang | H01L 21/76871 |
| 2019/0371734 A1* | 12/2019 | Chang | H01L 24/83 |
| 2019/0393153 A1* | 12/2019 | Wang | H01L 21/76898 |
| 2020/0006141 A1* | 1/2020 | Wang | H01L 23/3171 |
| 2020/0083201 A1* | 3/2020 | Suk | H01L 24/08 |
| 2020/0135708 A1* | 4/2020 | Chen | H01L 23/5389 |
| 2020/0227359 A1* | 7/2020 | Kang | H01L 24/06 |
| 2020/0343179 A1* | 10/2020 | Kuo | H01L 24/92 |
| 2020/0350223 A1* | 11/2020 | Shih | H01L 23/3121 |
| 2021/0118829 A1* | 4/2021 | Huang | H01L 23/5228 |
| 2021/0125947 A1* | 4/2021 | Shih | H01L 21/76895 |
| 2021/0202239 A1 | 7/2021 | Wu et al. | |
| 2021/0305094 A1 | 9/2021 | Chen et al. | |
| 2021/0375721 A1* | 12/2021 | Chen | H01L 24/03 |
| 2022/0020675 A1 | 1/2022 | Chen et al. | |
| 2022/0246565 A1* | 8/2022 | Yang | H01L 24/11 |
| 2022/0262749 A1* | 8/2022 | Chen | H01L 24/05 |
| 2023/0260941 A1 | 8/2023 | Hu | |
| 2025/0364464 A1 | 11/2025 | Hu | |

FOREIGN PATENT DOCUMENTS

| EP | 1482553 A2 * | 12/2004 | H01L 24/02 |
| KR | 20150006757 A | 1/2015 | |
| KR | 20190055728 A | 5/2019 | |
| KR | 20210122049 A | 10/2021 | |
| KR | 20220010412 A | 1/2022 | |
| KR | 20230123405 A | 8/2023 | |

* cited by examiner

METHOD FOR FORMING SEMICONDUCTOR REDISTRIBUTION STRUCTURES

PRIORITY CLAIM AND CROSS-REFERENCE

This application claims the benefit of U.S. Provisional Application No. 63/267,949, filed on Feb. 14, 2022, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figures 1, 2, 3:
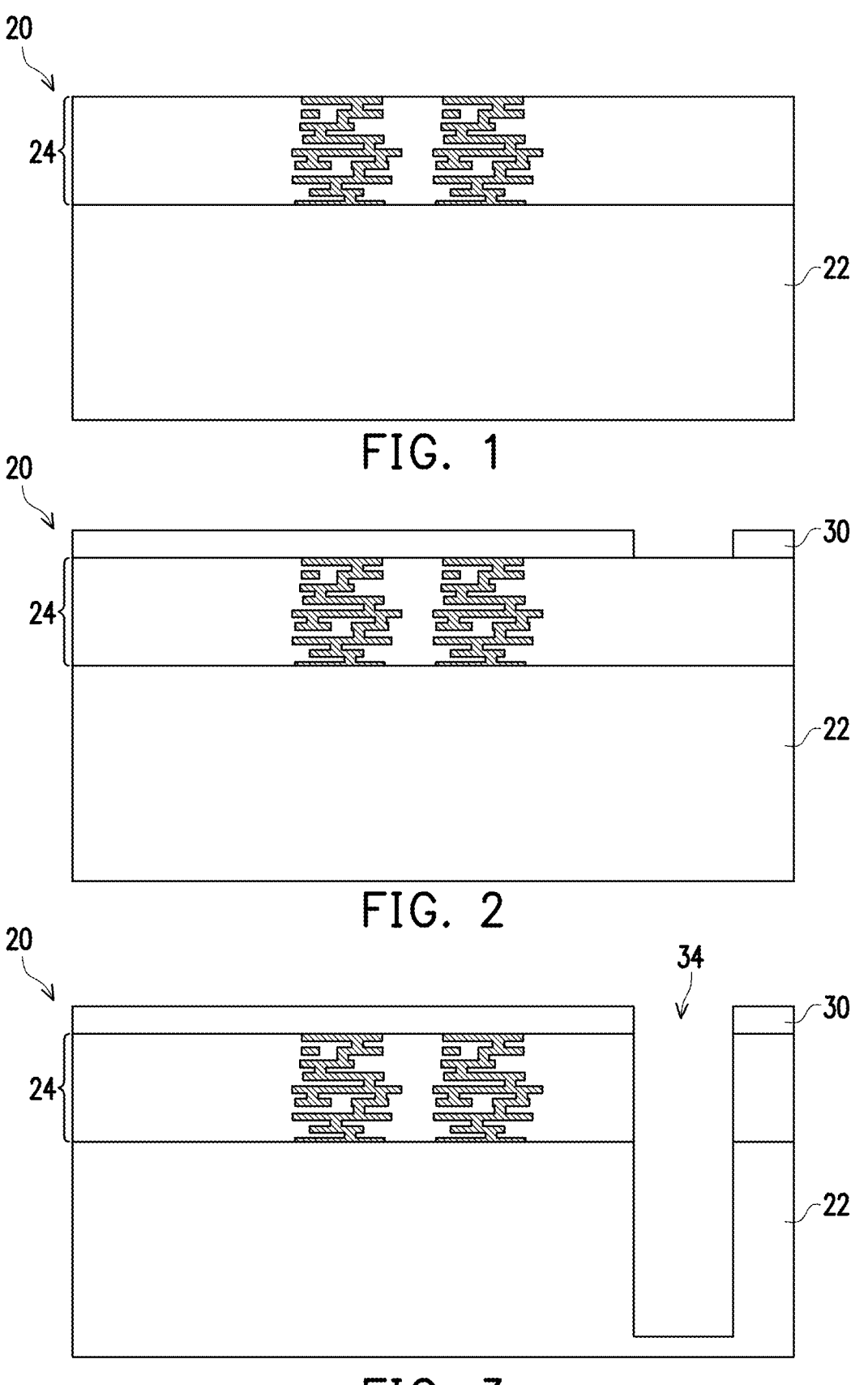
FIGS. 1 through 20 illustrate cross-sectional views of intermediate stages in the formation of a package according to an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a redistribution structure that can be integrated into a device (e.g., a chip or die) or a package (e.g., a chip-on-wafer (CoW) package structure or a wafer-on-wafer (WoW) package structure). The redistribution structure includes a redistribution via with a level or flat upper surface with an overlying pad to allow for a smaller pitch and minimum distance between adjacent redistribution vias and overlying pads. In some embodiments, the redistribution via is formed separately from the overlying pad using, for example, a single damascene process. In some embodiments, the redistribution via is formed in a same process as he overlying pad using, for example, a dual damascene process followed by a planarization process to level or flatten the upper surface of the overlying pad. In conventional structures, the redistribution via does not have a flat surface which forces the overlying bond vias and bond pads to be offset from the redistribution via. By having the top surface of the redistribution via and/or the top surface of the overlaying pad be a flat or level surface, bond vias and bond pads overlying the pad can be formed directly over the redistribution via and can have a minimum pitch reduced by at least 35%.

Further, the teachings of this disclosure are applicable to any redistribution structures where a flat top surface of a redistribution via and/or pad can reduce the minimum pitch of the redistribution structures. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the components may be sufficient to convey aspects of the embodiment. Further, method embodiments discussed herein may be discussed as being performed in a particular order; however, other method embodiments may be performed in any logical order.

FIGS. 1 through 26 illustrate cross-sectional views of intermediate stages in the formation of packages in accordance with some embodiments.

FIG. 1 illustrates a cross-sectional view of an integrated circuit die 20 in accordance with some embodiments. The integrated circuit die 20 will be packaged in subsequent processing to form an integrated circuit package. The integrated circuit die 20 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 20 may be formed in a wafer, which may include different device regions that are singulated in subsequent steps to form a plurality of integrated circuit dies. The integrated circuit die 20 may be processed according to applicable manufacturing processes to form integrated circuits. For example, the integrated circuit die 20 includes a substrate 22, such as silicon, doped or undoped, or an active layer of a semiconductor-on-insulator (SOI) substrate. The substrate 22 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 22 has an active surface (e.g., the surface facing upwards in FIG. 1), sometimes called a front side, and an inactive surface (e.g., the surface facing downwards in FIG. 1), sometimes called a back side.

Devices (not shown) may be formed at the front surface of the substrate 22. The devices may be active devices (e.g., transistors, diodes, etc.), capacitors, resistors, the like, or a combination thereof. An inter-layer dielectric (ILD) (not separately illustrated) is over the front surface of the substrate 22. The ILD surrounds and may cover the devices. The ILD may include one or more dielectric layers formed of materials such as Phospho-Silicate Glass (PSG), Boro-Silicate Glass (BSG), Boron-Doped Phospho-Silicate Glass (BPSG), Undoped Silicate Glass (USG), or the like.

Conductive plugs (not separately illustrated) extend through the ILD to electrically and physically couple the devices. For example, when the devices are transistors, the conductive plugs may couple the gates and source/drain regions of the transistors. The conductive plugs may be formed of tungsten, cobalt, nickel, copper, silver, gold, aluminum, the like, or combinations thereof. An interconnect structure 24 is over the ILD and the conductive plugs. The interconnect structure 24 interconnects the devices to form an integrated circuit. The interconnect structure 24 may be formed by, for example, metallization patterns in dielectric layers on the ILD. The metallization patterns include metal lines and vias formed in one or more low-k dielectric layers. The metallization patterns of the interconnect structure 24 are electrically coupled to the devices by the conductive plugs. The metallization patterns may be formed using any suitable process, such as a single damascene process, a dual damascene process, a plating process, combinations thereof, or the like.

After forming the interconnect structure 24, as shown in FIG. 2, a mask 30 is formed and patterned on the interconnect structure 23. In some embodiments, the mask 30 is a photoresist and may be formed by spin coating or the like and may be exposed to light for patterning. The pattern of the photoresist corresponds to an upper portion of the subsequently formed through substrate via (TSV) 44 (see, e.g., FIG. 6). The patterning forms at least one opening through the photoresist 30 to expose the interconnect structure 24. In some embodiments, a stop layer (not shown), such as a chemical mechanical polishing (CMP) stop layer is deposited over a top surface of the interconnect structure 24 before the mask 30. The CMP stop layer may be used to prevent a subsequent CMP process from removing too much material by being resistant to the subsequent CMP process and/or by providing a detectable stopping point for the subsequent CMP process. In some embodiments, the CMP stop layer may comprise one or more layers of dielectric materials. Suitable dielectric materials may include oxides (such as silicon oxide, aluminum oxide, or the like), nitrides (such as SiN, or the like), oxynitrides (such as SiON, or the like), oxycarbides (such as SiOC, or the like), carbonitrides (such as SiCN, or the like), carbides (such as SiC, or the like), combinations thereof, or the like, and may be formed using spin-on coating, chemical vapor deposition (CVD), plasma-enhanced CVD (PECVD), atomic layer deposition (ALD), the like, or a combination thereof.

In FIG. 3, the remaining mask 30 is used as a mask during an etching process to remove exposed and underlying portions of the dielectric layer(s) of the interconnect structure 24 and the substrate 22. A single etch process may be used to etch an opening 34 in the interconnect structure 24 and the substrate 22 or a first etch process may be used to etch the interconnect structure 24 and a second etch process may be used to etch the substrate 22. In some embodiments, the opening 34 is formed with a plasma dry etch process, a reactive ion etch (RIE) process, such as a deep RIE (DRIE) process. In some embodiments, the DRIE process includes etch cycle(s) and passivation cycle(s) with the etch cycle(s) using, for example, $SF_6$, and the passivation cycle(s) using, for example, $C_4F_8$. The utilization of a DRIE process with the passivation cycle(s) and the etch cycle(s) enables a highly anisotropic etching process. In some embodiments, the etch process(es) may any acceptable etching process, such as by wet or dry etching.

Figure 4:
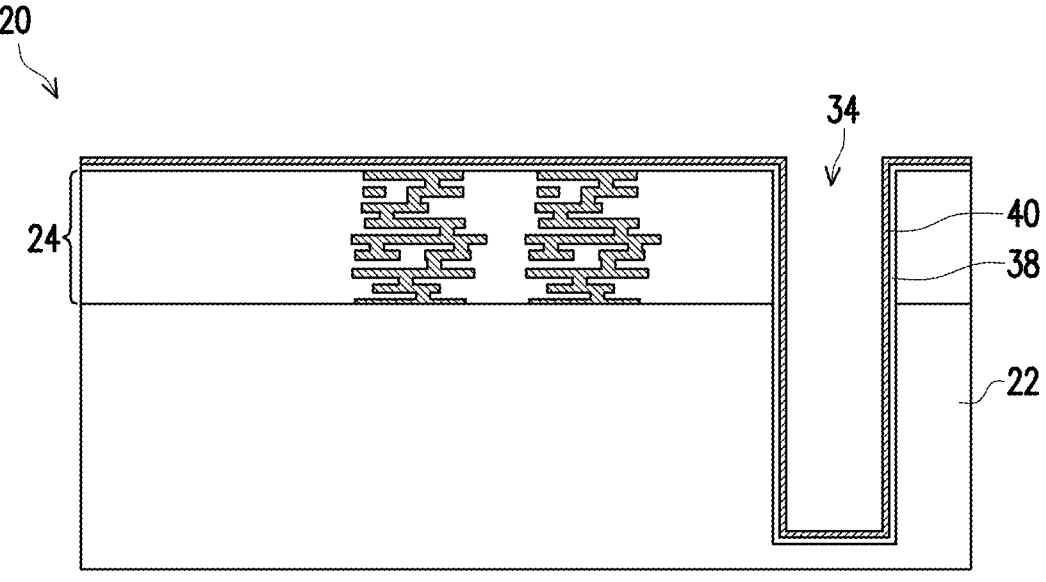

As illustrated in FIG. 4, after forming the opening 34, the photoresist 30 is removed. The photoresist 30 may be removed by an acceptable ashing or stripping process, such as using an oxygen plasma or the like.

Further in FIG. 4, a liner layer 38 is conformally deposited on the interconnect structure 24 and on the bottom surface and sidewalls of the opening 34. In some embodiments, the liner layer 38 includes one or more layers of dielectric materials and may be used to physically and electrically isolate the subsequently formed through vias from the substrate 22. Suitable dielectric materials may include oxides (such as silicon oxide, aluminum oxide, or the like), nitrides (such as SiN, or the like), oxynitrides (such as SiON, or the like), combinations thereof, or the like. The liner layer 38 may be formed using CVD, PECVD, ALD, the like, or a combination thereof.

In a subsequent step, as shown in FIG. 4, a seed layer 40 is formed over liner layer 38. In some embodiments, the seed layer 40 is a metal layer, which may be a single layer or a composite layer comprising a plurality of sub-layers formed of different materials. In some embodiments, the seed layer 40 comprises a titanium layer and a copper layer over the titanium layer. The seed layer may be formed using, for example, physical vapor deposition (PVD) or the like. In some embodiments, a barrier layer (not shown) may be formed on the liner layer 38 prior to forming the seed layer 40. The barrier layer may comprise Ti, TiN, the like, or a combination thereof.

Figure 5:
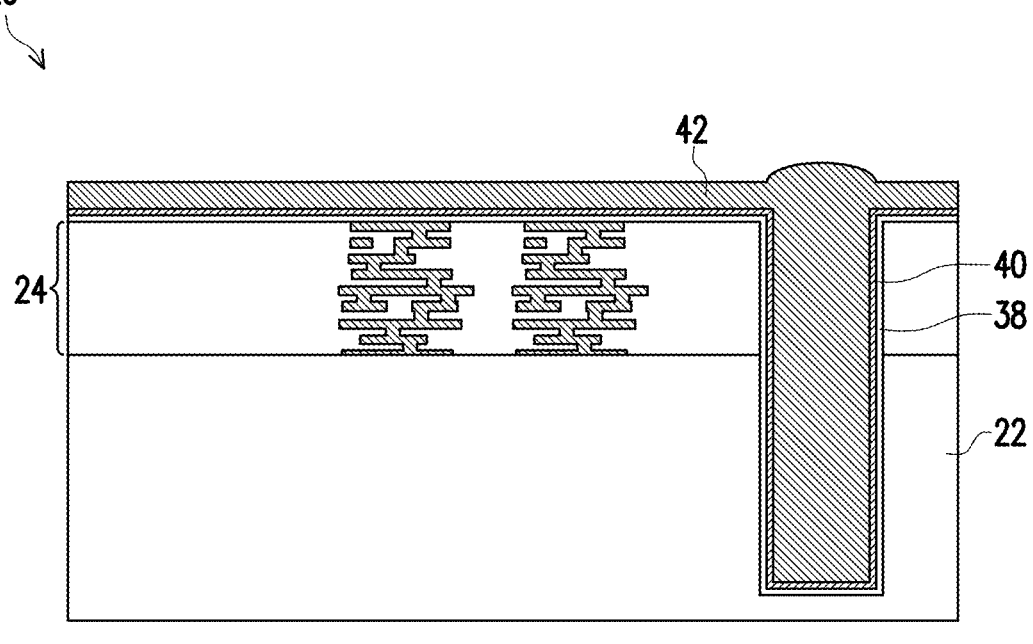

In FIG. 5, a conductive material 42 is formed on the seed layer 40 and fills the opening 34. The conductive material 42 may be formed by plating, such as electroplating including electrochemical plating, electroless plating, or the like. The conductive material may comprise a metal, like copper, titanium, tungsten, aluminum, or the like.

After the conductive material 42 is formed, an anneal process is then performed. The anneal process may be performed to prevent subsequent extrusion of the conductive material of the TSV 44 (sometime referred to as TSV pumping). The TSV pumping is caused by a coefficient of thermal expansion (CTE) mismatch between the conductive material 42 and the substrate 22 and can cause damage to structures (e.g., metallization patterns) over the TSV.

Figure 6:
Figure 6:
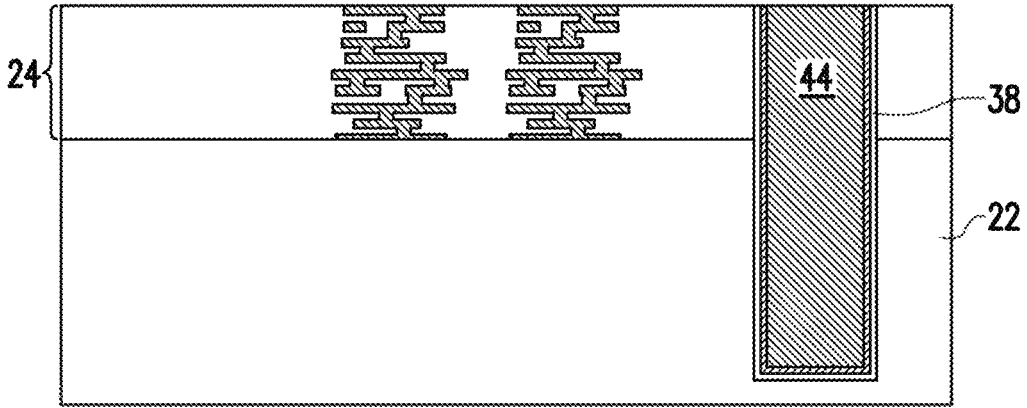

Following the anneal process, a planarization process is performed to remove portions of the conductive material 42, the seed layer 40, and the liner layer 38 outside the openings 34 to form a TSV 44 as illustrated in FIG. 6. Top surfaces of the TSV 44 and the topmost dielectric layer of the interconnect structure 24 are coplanar after the planarization process within process variations. The planarization process may be, for example, a chemical-mechanical polish (CMP), a grinding process, or the like. The upper portion of the TSV 44 (formed in the interconnect structure 24) has a greater width than the lower portion of the TSV 44 (formed in the substrate 22).

Figure 7:
Figure 7:
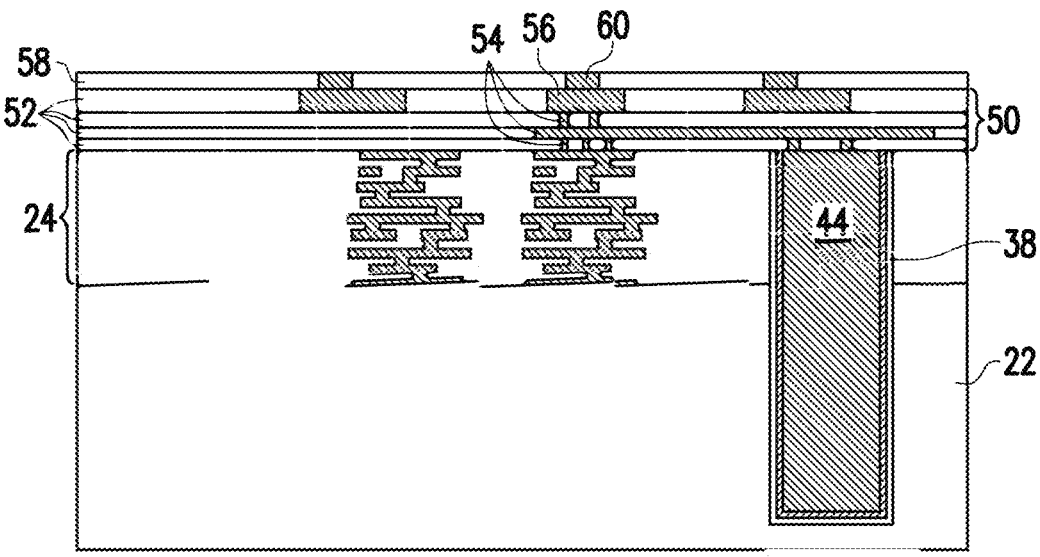
Figure 14:
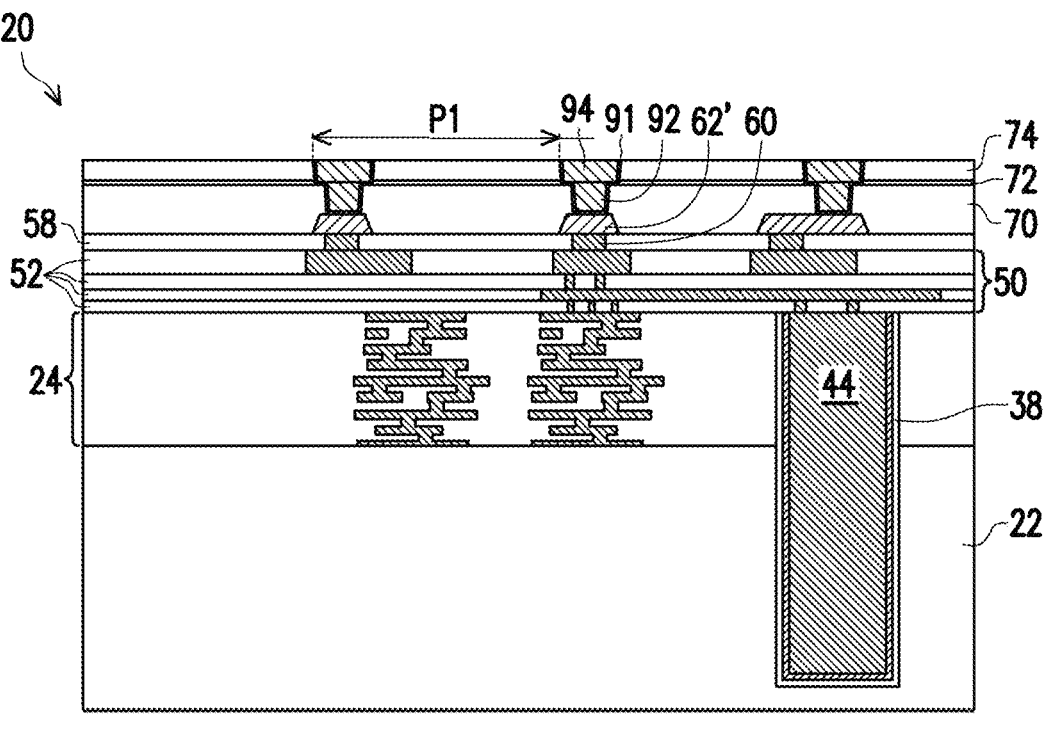

Referring to FIG. 7, an interconnect structure 50 is formed over the structure of FIG. 6. The interconnect structure 50 includes dielectric layers 52, metallization patterns and vias 54, and top metal 56. More or fewer dielectric layers and metallization patterns and vias may be formed than is shown in FIG. 14. The interconnect structure 50 is connected to the interconnect structure 24 and TSV 44 by metallization patterns and vias formed in the dielectric layer(s) 52. The metallization patterns and vias may be formed similar processes and materials as the interconnect structure 24 and the description is not repeated herein. In some embodiments, there are more than one layer of top metal 56, such as two top metal layers.

In some embodiments, the dielectric layers 52 are a same material as the dielectric layers of the interconnect structure 24, e.g., low-k dielectric. In other embodiments, the dielectric layers 52 are formed of a silicon-containing oxide (which may or may not include oxygen). For example, the dielectric layers 52 may include an oxide such as silicon oxide, a nitride such as silicon nitride, or the like.

The metallization patterns and vias 54 and the top metal 56 may be formed using any suitable process, such as a single damascene process, a dual damascene process, a plating process, combinations thereof, or the like. An example of forming the metallization patterns and vias 54 and the top metal 56 by a damascene process includes etching dielectric layers 52 to form openings, depositing a conductive barrier layer into the openings, plating a metallic material such as copper or a copper alloy, and performing a planarization to remove the excess portions of the metallic material. In other embodiments, the formation of the dielectric layers 52, the metallization patterns and vias 54, and the top metal 56 may include forming the dielectric layer 52, patterning the dielectric layer 52 to form openings, forming a metal seed layer (not shown), forming a patterned plating mask (such as photoresist) to cover some portions of the metal seed layer, while leaving other portions exposed, plating the metallization patterns and vias 54 and the top metal 56, removing the plating mask, and etching undesirable portions of the metal seed layer. The metallization patterns and vias 54 and top metal 56 may be made of tungsten, cobalt, nickel, copper, silver, gold, aluminum, the like, or combinations thereof. In some embodiments, the top metal 56 is thicker than the metallization patterns 54, such as three times thicker, five times thicker, or any suitable thickness ratio between the metallization layers.

FIG. 7 further illustrates the formation of a passivation layer 58 over the dielectric layers 52 and a redistribution via 60 in the passivation layer 58. In some embodiments, the passivation layer 58 is formed of a same material as the dielectric layers 52. In some embodiments, the passivation layer 58 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; the like; or a combination thereof. The passivation layer 58 may be formed, for example, by spin coating, lamination, chemical vapor deposition (CVD), or the like. The passivation layer 58 may have an upper surface that is substantially level within process variations.

The redistribution via 60 may be formed using any suitable process, such as a single damascene process, a dual damascene process, a plating process, combinations thereof, or the like. The redistribution via 60 may be formed of similar materials and processes as the metallization patterns and vias 54 and the description is not repeated herein. By having the top surface of the redistribution via and/or the top surface of the overlaying pad be a flat or level surface, bond vias and bond pads overlying the pad can be formed directly over the redistribution via and can have a minimum pitch reduced by at least 35%.

Figure 8:
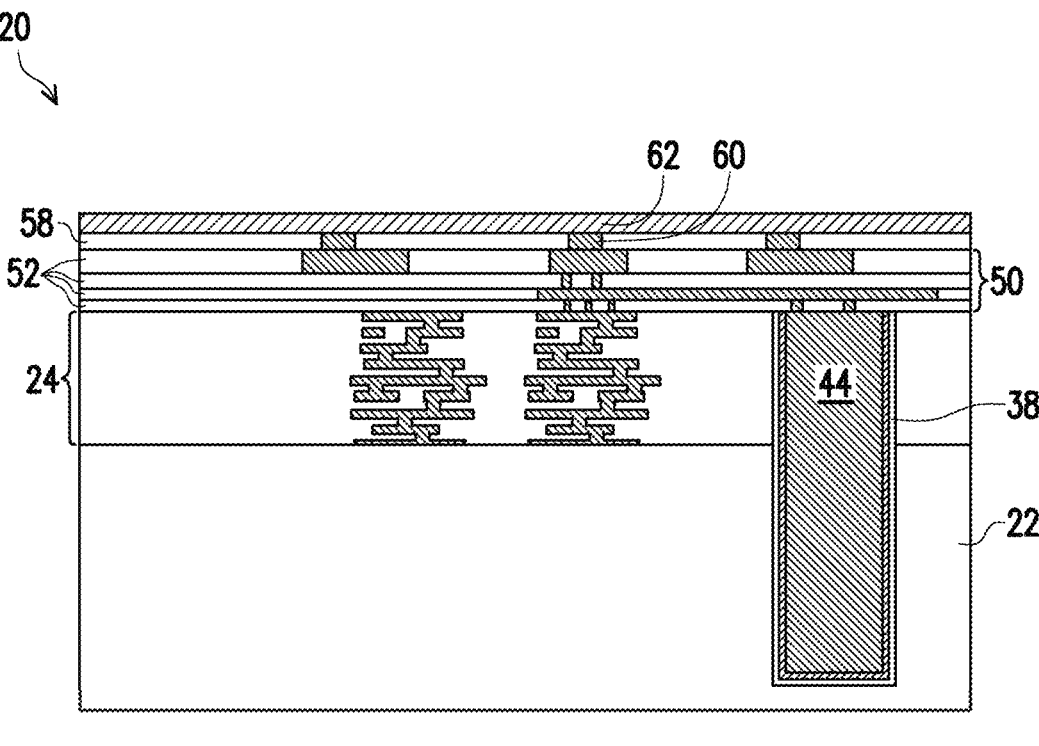

FIG. 8 illustrates the formation of a redistribution pad layer 62 over the redistribution vias 60 and the passivation layer 58. Because the top surfaces of the redistribution vias 60 and the passivation layer 58 are flat and coplanar, the top surface of the redistribution pad layer 62 is flat or level. As discussed previously and below, these flat top surfaces allow for a reduced minimum pitch. The redistribution pad layer 62 is physically contacting the redistribution vias 60. In some embodiments, the redistribution pad layer 62 is formed through plating processes. In an embodiment, a seed layer is seed layer (not shown) is formed and metallic material is plated over the seed layer. The seed layer may be formed using, for example, PVD or the like. The plating process may be electroplating including electrochemical plating, electroless plating, or the like. The redistribution pad layer 62 may be formed of similar materials and processes as the redistribution via 60 and the description is not repeated herein. In some embodiments, the redistribution via 60 and the redistribution pad layer 62 are formed of same materials, and, in other embodiments, they are formed of different materials.

Figure 9:
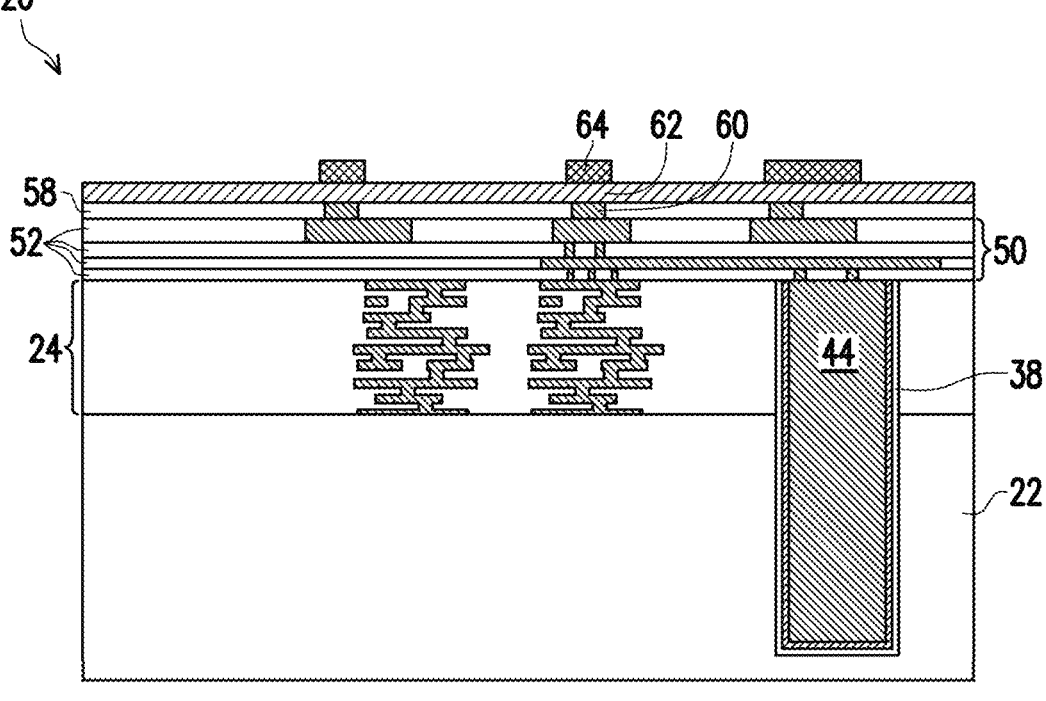

In FIG. 9, a photoresist 64 is formed and patterned on the redistribution pad layer 62. The photoresist 64 may be formed by spin coating or the like and may be exposed to light for patterning. The pattern of the photoresist corresponds to the redistribution pads 62 (see FIG. 10).

Figure 10:
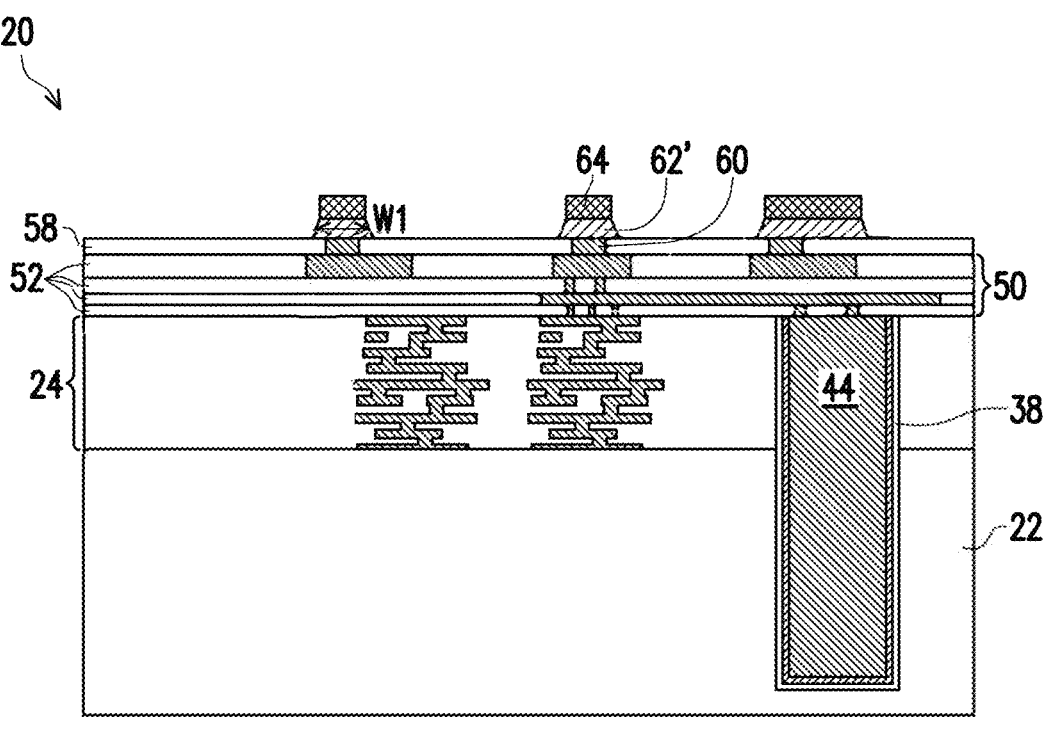

FIG. 10 illustrates the patterning of the redistribution pad layer 62 using the patterned photoresist 64 as a mask to form redistribution pads 62. The exposed portions of the redistribution pad layer 62 may be removed, such as by using an acceptable etching process, such as by wet and/or dry etching. The remaining portions of the seed layer and conductive material form the redistribution pads 62. After patterning, sidewalls of the redistribution pads 62 may be perpendicular to a top surface of the passivation layer 58. In some embodiments, the sidewalls of the redistribution pads 62 may not be exactly perpendicular to a top surface of the passivation layer 58 and may slanted or diagonal. As illustrated in FIG. 10, the redistribution pads 62 may be wider proximate a surface of the passivation layer 58 than they are distal the surface of the passivation layer 58. In some embodiments, the redistribution pads 62 have a width W1 at a bottom surface of the redistribution pads 62 (i.e., proximate the top surface of the passivation layer 58). In some embodiments, the width W1 is as small as 1.8 μm. In some embodiments, the width W1 is in a range from 1.8 μm to 3.6 μm.

Figure 11:
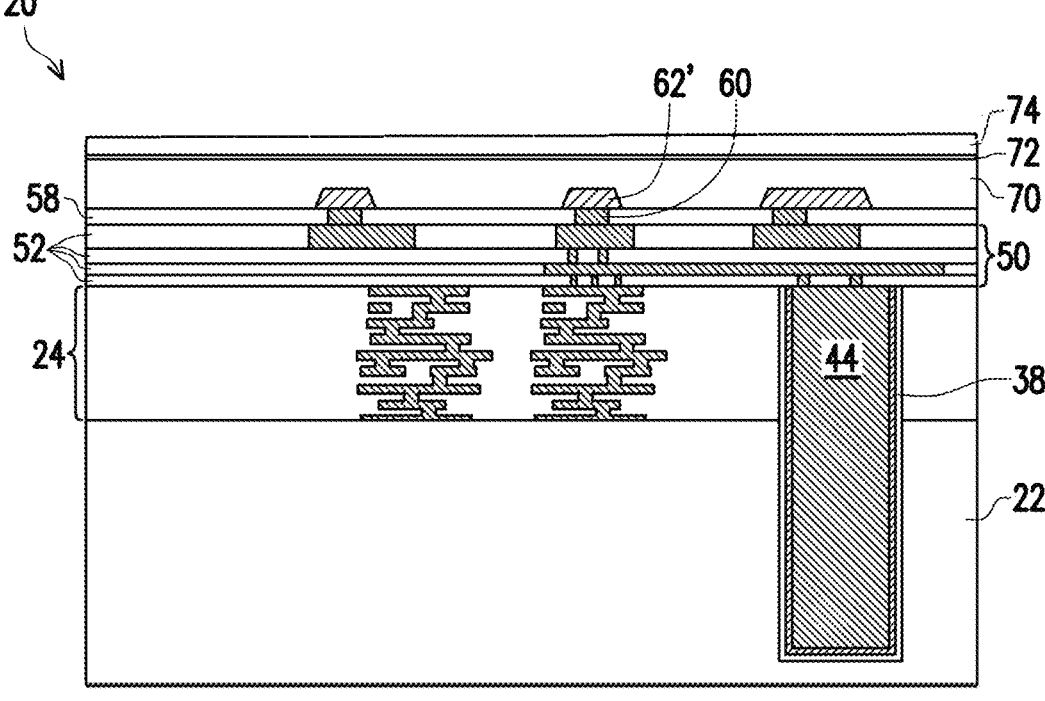

FIG. 11 illustrates the removal of the photoresist 64 and the formation of dielectric layers on the passivation layer 58 and redistribution pads 62. The photoresist 64 may be removed by an acceptable ashing or stripping process, such as using an oxygen plasma or the like.

Further in FIG. 11, dielectric layers 70, 72, and 74 are formed over the passivation layer 58 and the redistribution pads 62. Although FIG. 11 illustrates three dielectric layers 70, 72, and 74, more or fewer than three dielectric layers may be formed. The dielectric layer 70 provides a planar top surface to form the dielectric layers 72 and 74 on and may be considered a planarization dielectric layer 70. The dielectric layer 72 may provide etch stop functions during subsequent formation of bond pads and bond vias and may be considered an etch stop layer 72. The dielectric layer 72 may provide dielectric bonding functions and may be considered a bonding dielectric layer 74.

In some embodiments, the dielectric layers 70, 72, and 74 are formed of a silicon-containing oxide. For example, the dielectric layers 52 may include an oxide such as silicon oxide, a nitride such as silicon nitride, an oxynitride such as silicon oxynitride, the like, or a combination thereof.

Figure 12:
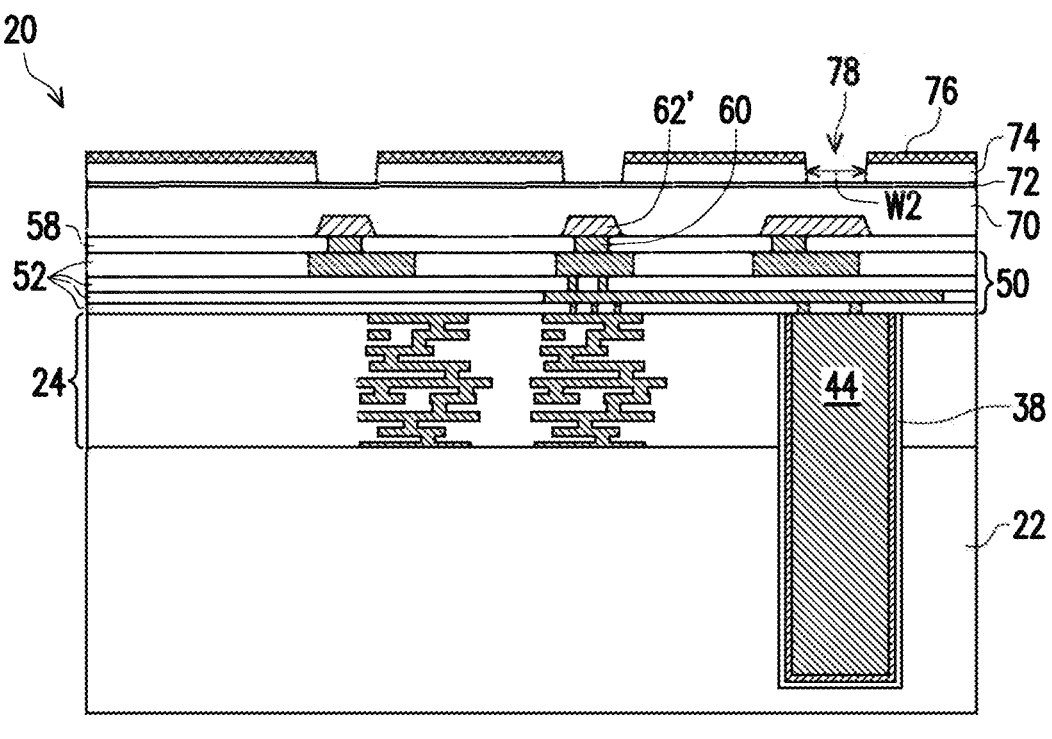
Figure 13:
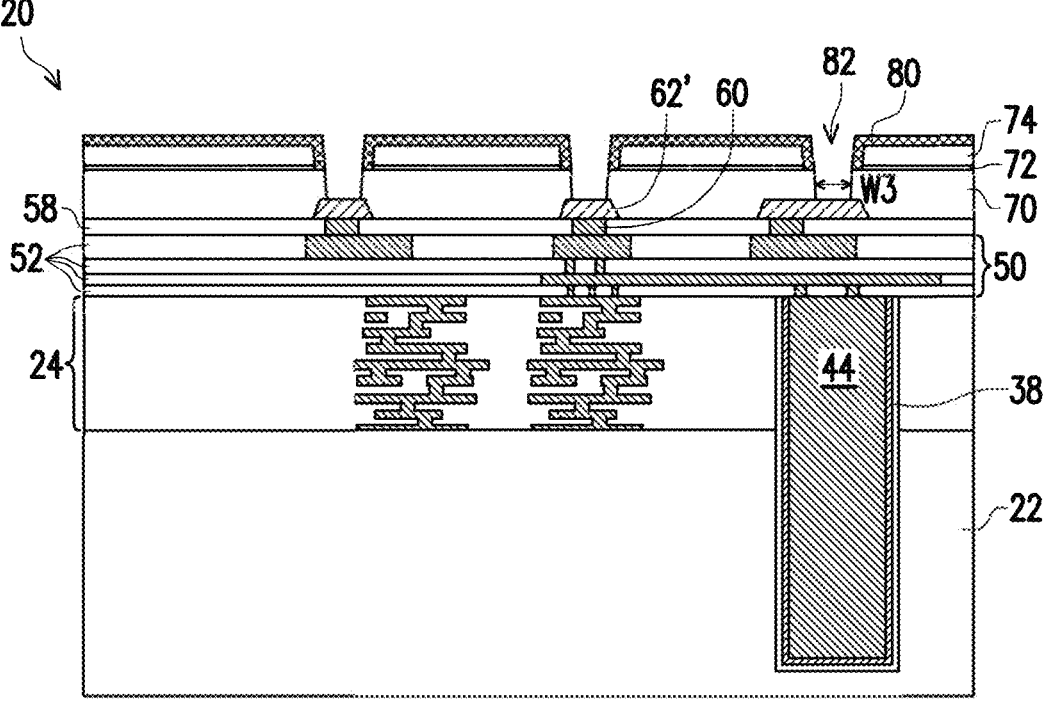

FIGS. 12 through 14 illustrate the formation of bond pad vias 92 and bond pads 94 are formed in the dielectric layers 70, 72, and 74. The bond pad vias 92 and bond pads 94 may be formed using be achieved using any suitable process, such as a single damascene process, a dual damascene process, combinations thereof, or the like. FIGS. 12 through 14 illustrate a dual damascene process.

In FIG. 12, a photoresist 76 is formed and patterned on the dielectric layer 74. The photoresist 76 may be formed by spin coating or the like and may be exposed to light for patterning. The pattern of the photoresist corresponds to openings 78 for the bond pads 94 (see FIG. 14). Further in FIG. 12, the dielectric layer 74 is patterned to form the openings 78 using the patterned photoresist 76 as a mask with the patterning process stopping on the dielectric layer 72. The exposed portions of the dielectric layer 74 may be removed, such as by using an acceptable etching process, such as by wet and/or dry etching. The openings 78 have a width W2. In some embodiments, the width W2 is as small as 1.4 μm. In some embodiments, the width W2 is in a range from 1.4 μm to 2.5 μm.

FIG. 13 illustrates the removal of the photoresist 76, the formation and patterning of photoresist 80, and the patterning of dielectric layers 72 and 70. The photoresist 76 may be removed by an acceptable ashing or stripping process, such as using an oxygen plasma or the like. Further in FIG. 13, the photoresist 80 is formed and patterned on the patterned dielectric layer 74. The photoresist 80 may be formed by spin coating or the like and may be exposed to light for patterning. The pattern of the photoresist corresponds to openings 82 for the bond pad vias 92 (see FIG. 14). Further in FIG. 13, the dielectric layers 72 and 70 are patterned to form the openings 82 using the patterned photoresist 80 as a mask with the patterning process exposing portions of the redistribution pads 62. The exposed portions of the dielectric layers 72 and 70 may be removed, such as by using an acceptable etching process, such as by wet and/or dry etching. The openings 82 have a width W3. In some embodiments, the width W3 is as small as 0.6 μm. In some embodiments, the width W3 is in a range from 0.6 μm to 1.8 μm.

FIG. 14 illustrates the removal of the photoresist 80 and the formation of a barrier layer 91, the bond pad vias 92, and the bond pads 94 in the openings 78 and 82. The barrier layer 91 may be formed in the openings prior to forming bond pad vias 92 and the bond pads 94. In some embodiments, the barrier layer 91 may comprise Ti, TiN, the like, or a combination thereof. The bond pad vias 92 and the bond pads 94 may be formed by similar processes and materials as the metallization patterns and vias 54, the redistribution vias 60, and/or the redistribution pads 62 and the description is not repeated herein. The bond pads 94 may be formed of or comprise copper, for example. Adjacent bond pads 94 have a pitch P1. In some embodiments, the pitch P1 is as small as 3.0 μm. In some embodiments, the pitch P3 is in a range from 3.0 μm to 5.4 μm. In accordance with embodiments with the bond vias and bond pads formed directly over (e.g., overlapping) the redistribution via, adjacent redistribution and bond structures can have a minimum pitch reduced by at least 35%.

The top surfaces of the bond pads 94 are coplanar with the top surface of the uppermost dielectric layer 74. The planarization is achieved through a chemical mechanical polishing (CMP) process or a mechanical grinding process.

Figure 15:
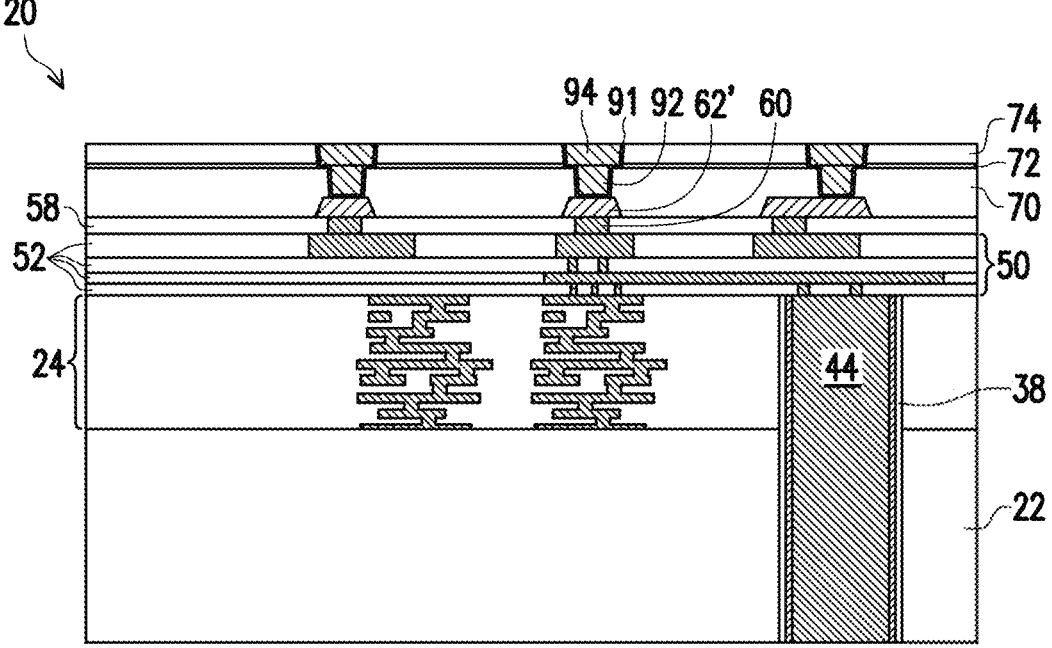

As shown in FIG. 15, the integrated circuit die 20 is thinned by thinning the substrate 22 before the subsequent singulation process. The thinning may be performed through a planarization process such as a mechanical grinding process or a CMP process. The thinning process exposes the TSV 44 and the liner 38. After thinning, the through via 44 provides electrical connection from a back side of the substrate 22 to a front side of the substrate 22 (e.g., the interconnects 24 and 50 and bond pads 94).

Figure 16:
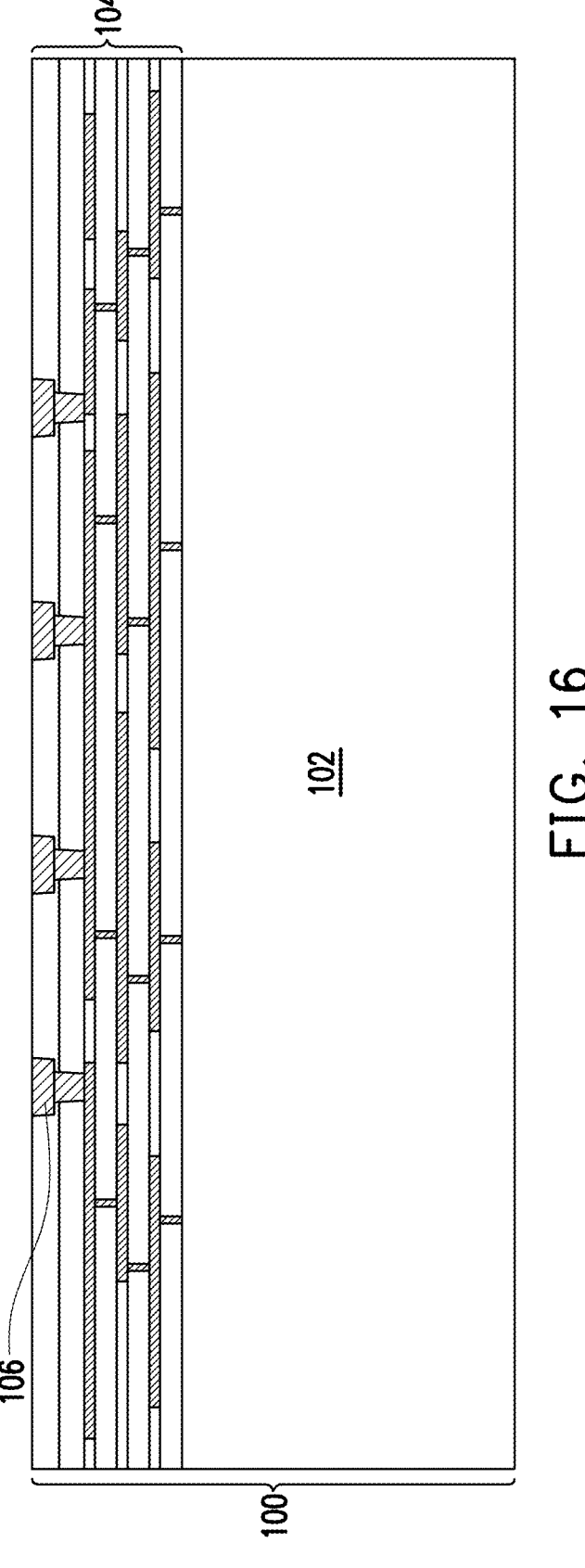

FIG. 16 illustrates a package structure 100. The package structure 100 includes a substrate 102, similar to the substrate 22 of the integrated circuit die 20, and an interconnect structure 104 including bond pads 106. The interconnect structure 104 and the bond pads 106 may be similar to the interconnect structures 24 and 50 and bond pads 94, respectively, described above and the descriptions are not repeated herein.

Figure 17:
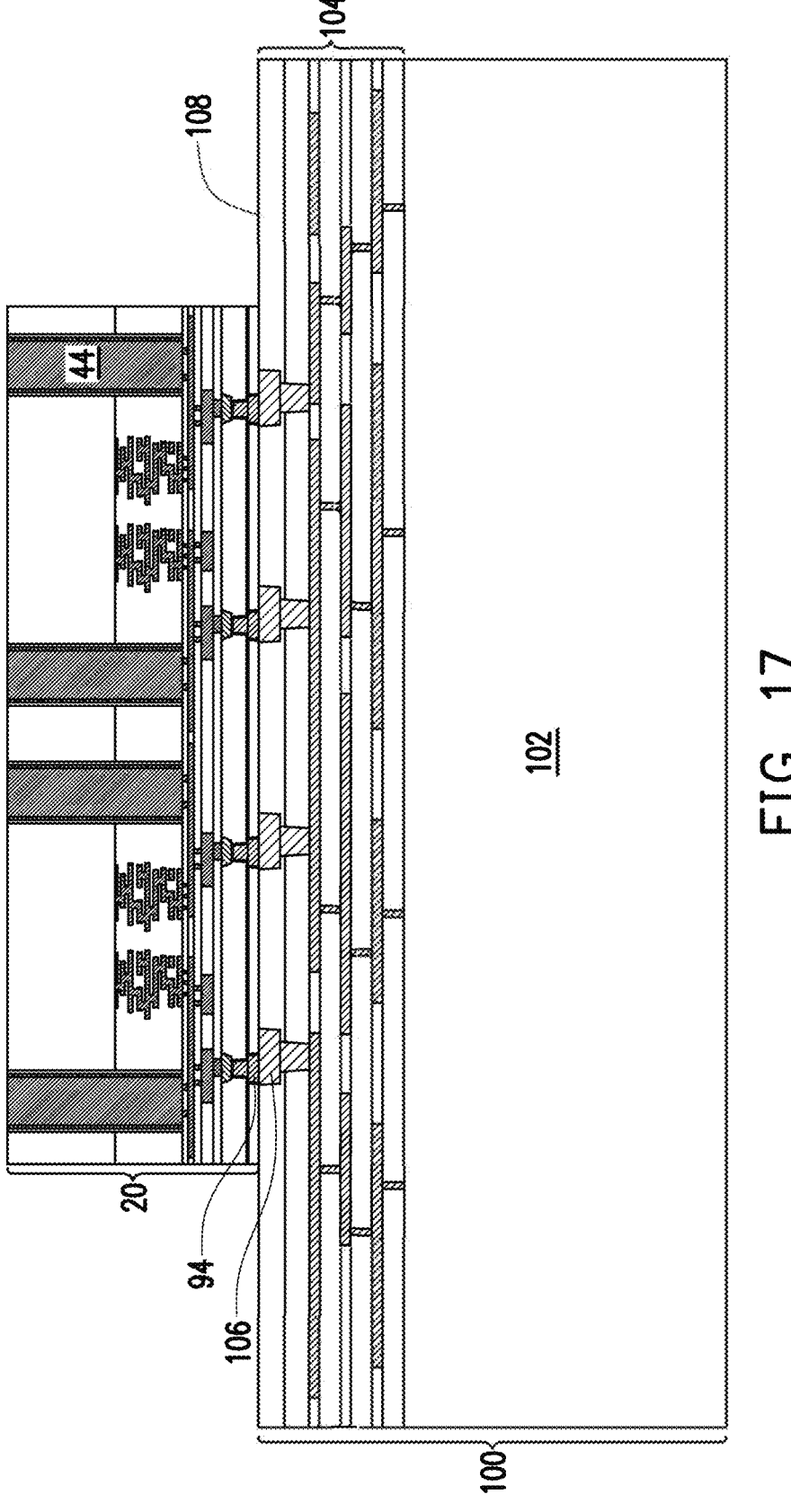

In FIG. 17, the integrated circuit die 20 is bonded to the package structure 100. The bonding of the integrated circuit die 20 to the package structure 100 may be achieved through hybrid bonding, in which both metal-to-metal direct bonding (between the bond pads 94 and 106) and dielectric-to-dielectric bonding (such as Si—O—Si bonding between surface dielectric layers of the integrated circuit die 20 and the package structure 100) are formed. Furthermore, there may be a single integrated circuit die 20 or a plurality of dies 20 bonded to the same package structure 100. The plurality of dies 20 bonded to the same package structure 100 may be identical to, or different from, each other to form a homogenous or a heterogeneous structure.

The die 20 is disposed face down such that the front sides of the die 20 face the package structure 100 and the back sides of the dies 20 face away from the package structure 100. The die 20 is bonded to the package structure 100 at an interface 108. As illustrated by FIG. 16, the hybrid bonding process directly bonds the topmost dielectric layer of the interconnect 104 of the package structure 100 to the topmost dielectric layer 90 of the die 20 at the interface 108 through fusion bonding. In an embodiment, the bond between the topmost dielectric layer of the interconnect 104 and the topmost dielectric layer 90 of the die 20 may be an oxide-to-oxide bond. The hybrid bonding process further directly bonds the bond pads 94 of the die 20 to the bond pads 106 of the package structure 100 at the interface 108 through direct metal-to-metal bonding. Thus, electrical connection can between the die 20 and the package structure 100 is provided by the physical connection of the bond pads 94 to the bond pads 106.

As an example, the hybrid bonding process starts with aligning the die 20 with the package structure 100, for example, by aligning the bond pads 94 to the bond pads 106. When the die 20 and the package structure 100 are aligned, the bond pads 94 may overlap with the corresponding bond pads 106. Next, the hybrid bonding includes a pre-bonding step, during which the die 20 is put in contact with the package structure 100. The hybrid bonding process continues with performing an anneal, for example, at a temperature between about 150° C. and about 400° C. for a duration between about 0.5 hours and about 3 hours, so that the copper in the bond pads 94 and the bond pads 106 inter-diffuses to each other, and hence the direct metal-to-metal bonding is formed.

Figure 18:
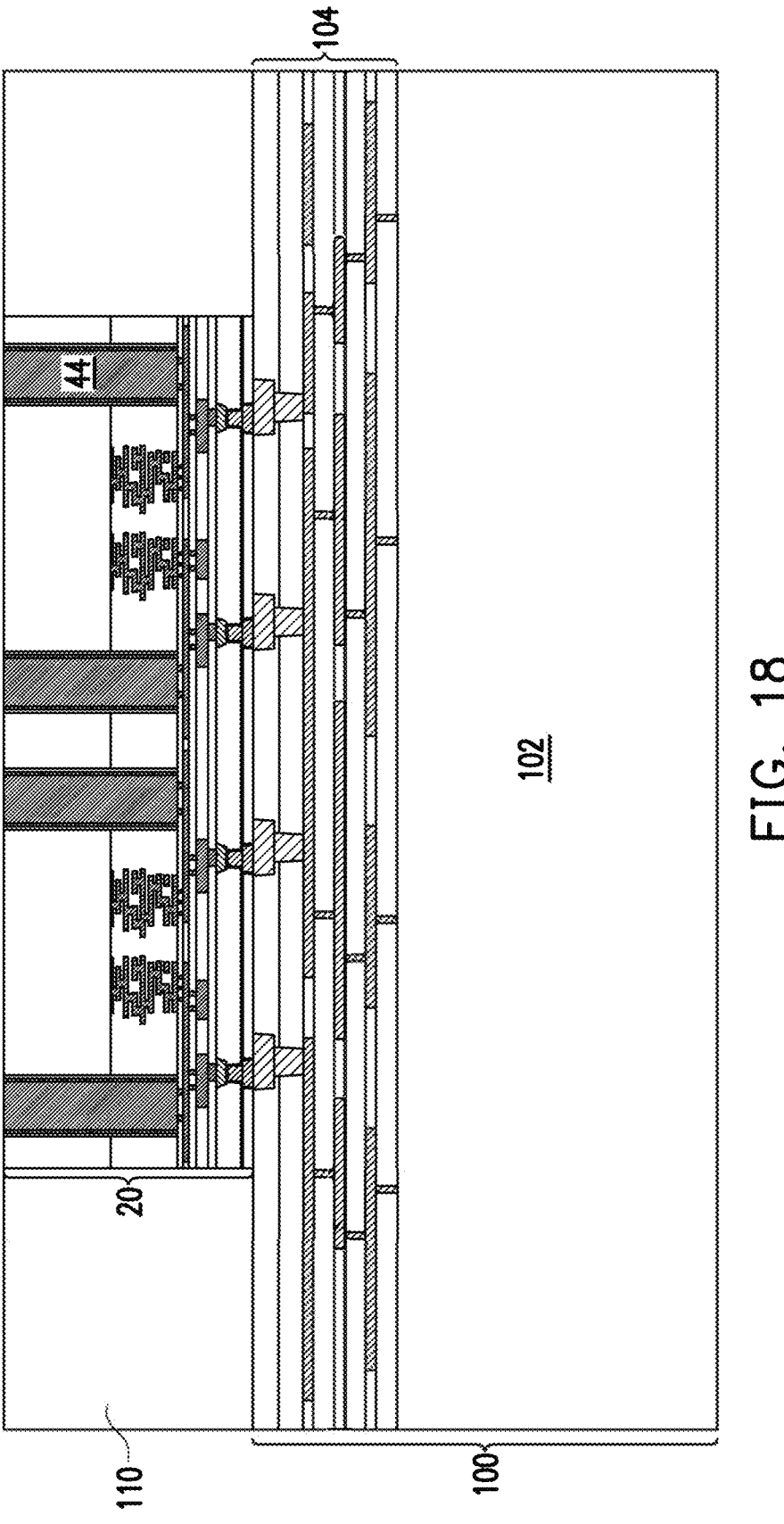

Next, as shown in FIG. 18, a gap-filling process is performed to encapsulate the integrated circuit die 20 in an encapsulant 110. After formation, the encapsulant 110 encapsulates the integrated circuit die 20. The encapsulant 110 may comprise an oxide. Alternatively, the encapsulant may be a molding compound, a molding underfill, a resin, an epoxy, or the like. The encapsulant 110 may be applied by compression molding, transfer molding, or the like, and may be applied in liquid or semi-liquid form and then subsequently cured. After the encapsulant 110 is deposited, a planarization process is performed to level a back-side surface of the integrated circuit die 20 with the top surface of the encapsulant 110 and to expose the TSVs 44. Surfaces of the TSVs 44, the substrate 22, and the encapsulant 110 are substantially coplanar after the planarization process within process variations. The planarization process may be, for example, a CMP a grinding process, or the like. In some embodiments, the planarization may be omitted, for example, if the TSVs 44 are already exposed.

Figure 19:
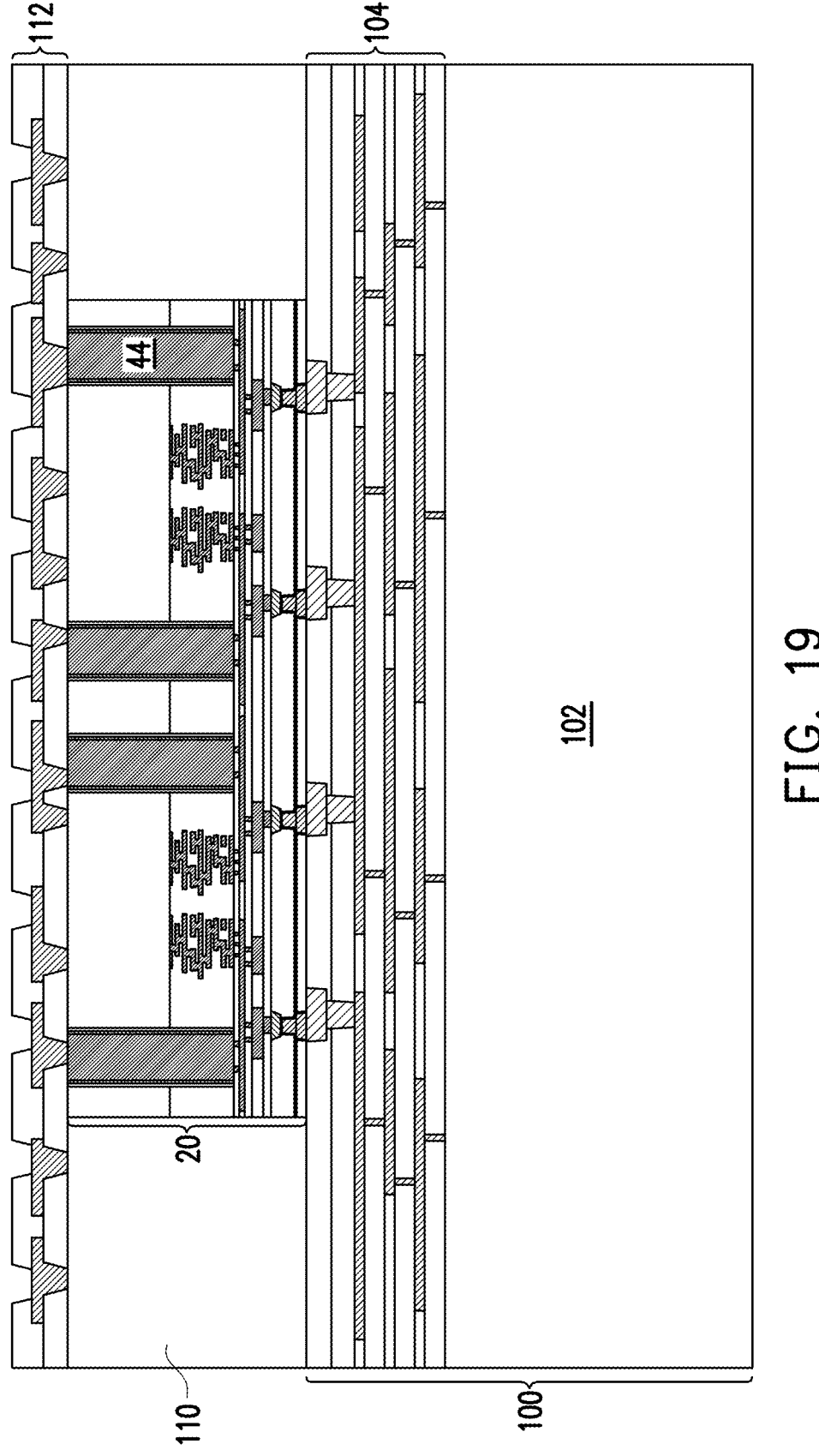

In FIG. 19, a redistribution structure 112 is deposited on the encapsulant 110, the TSVs 44, and the integrated circuit die 20. The redistribution structure 112 may include redistribution lines (RDLs), such as metal traces (or metal lines), and vias underlying and connected to the metal traces. The redistribution lines of the redistribution structure 112 are physically and electrically connected to the TSVs 44 of the die 20.

In accordance with some embodiments of the present disclosure, the RDLs are formed through plating processes, wherein each of the RDLs includes a seed layer (not shown) and a plated metallic material over the seed layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the RDLs. The patterning forms openings through the photoresist to expose the seed layer. A conductive material is formed in the openings of the photoresist and on the exposed portions of the seed layer. The conductive material may be formed by plating, such as electroplating or electroless plating, or the like. The seed layer and the plated metallic material may be formed of the same material or different materials. The conductive material may be a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet and/or dry etching. The remaining portions of the seed layer and conductive material form the RDLs.

Dielectric or passivation layers may be formed over each layer of the metal traces. In some embodiments, the dielectric or passivation layers are formed of a polymer, which may be a photo-sensitive material such as PBO, polyimide, BCB, or the like, that may be patterned using a lithography mask. In other embodiments, the dielectric or passivation layers are formed of a nitride such as silicon nitride; an oxide such as silicon oxide, PSG, BSG, BPSG; or the like. The dielectric or passivation layers may be formed by spin coating, lamination, CVD, the like, or a combination thereof.

Openings may be formed in the top dielectric or passivation layer with a patterning process, exposing some or all of the top metal layer of the redistribution structure 112. The patterning process may be an acceptable process, such as by exposing the dielectric or passivation layer to light when the dielectric layer is a photo-sensitive material or by etching using, for example, an anisotropic etch.

Figure 20:
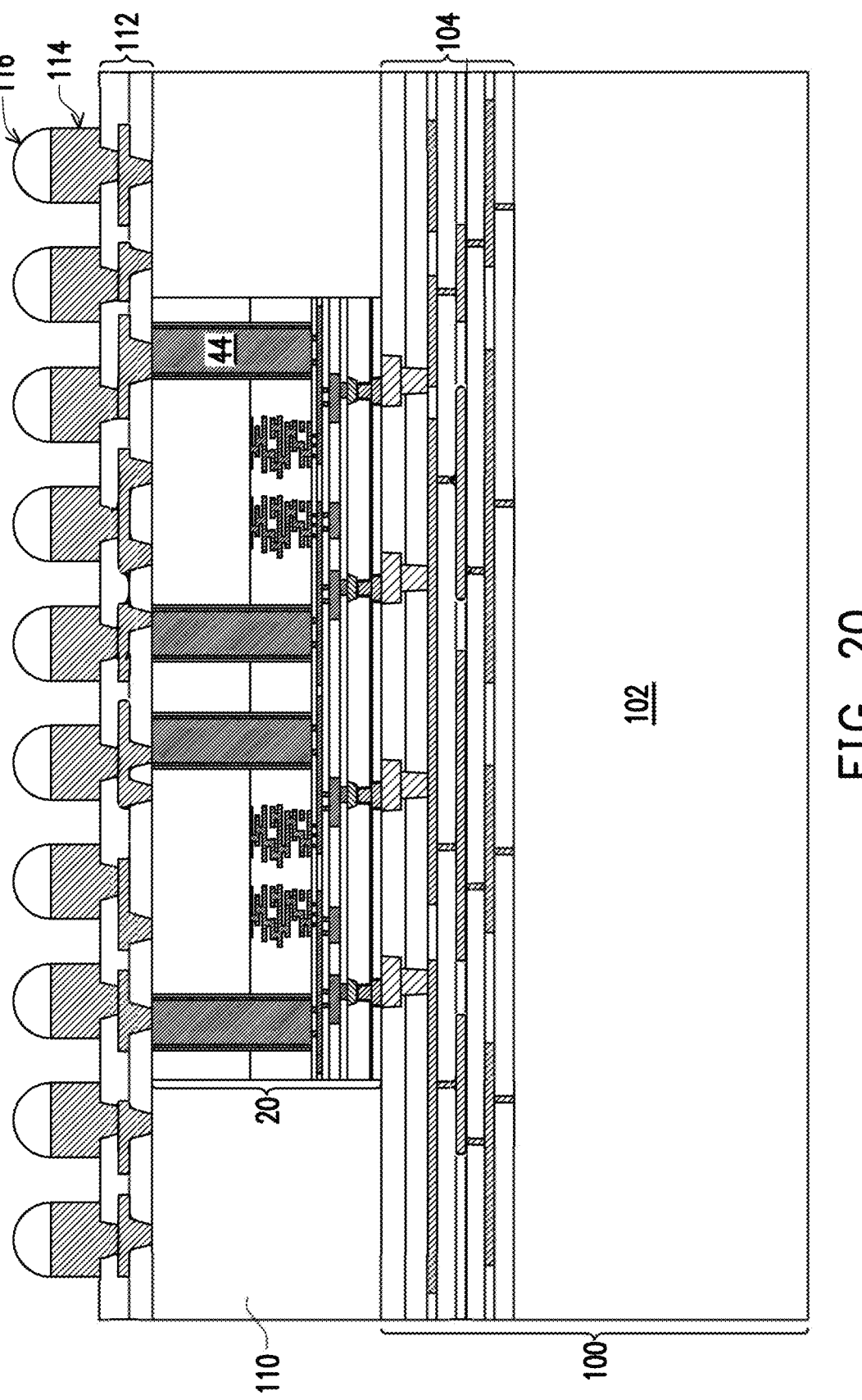

As shown in FIG. 20, bumps 114 are formed through the openings in the dielectric layers of the redistribution structure 112 to contact metallization patterns in the redistribution structure 112. The bumps 114 may be metal pillars, controlled collapse chip connection (C4) bumps, micro bumps, electroless nickel-electroless palladium-immersion gold technique (ENEPIG) formed bumps, ball grid array (BGA) bumps, or the like. In an embodiment, the bumps 114 are C4 bumps. The bumps 114 may be formed by sputtering, printing, electro plating, electroless plating, CVD, or the like. The bumps 114 may be solder free and have substantially vertical sidewalls. In some embodiments, a metal cap layer (not shown) is formed on the top of the bumps 114. The metal cap layer may include nickel, tin, tin-lead, gold, silver, palladium, indium, nickel-palladium-gold, nickel-gold, the like, or a combination thereof and may be formed by a plating process.

Further shown in FIG. 20, conductive connectors 116 are formed on the bumps 114. The conductive connectors 116 may be formed from a conductive material such as solder, copper, aluminum, gold, nickel, silver, palladium, tin, the like, or a combination thereof. In some embodiments, the conductive connectors 116 are formed by initially forming a layer of solder through methods such as evaporation, electroplating, printing, solder transfer, ball placement, or the like. Once a layer of solder has been formed on the structure, a reflow may be performed in order to shape the conductive connectors 116 into desired bump shapes.

Figure 21:
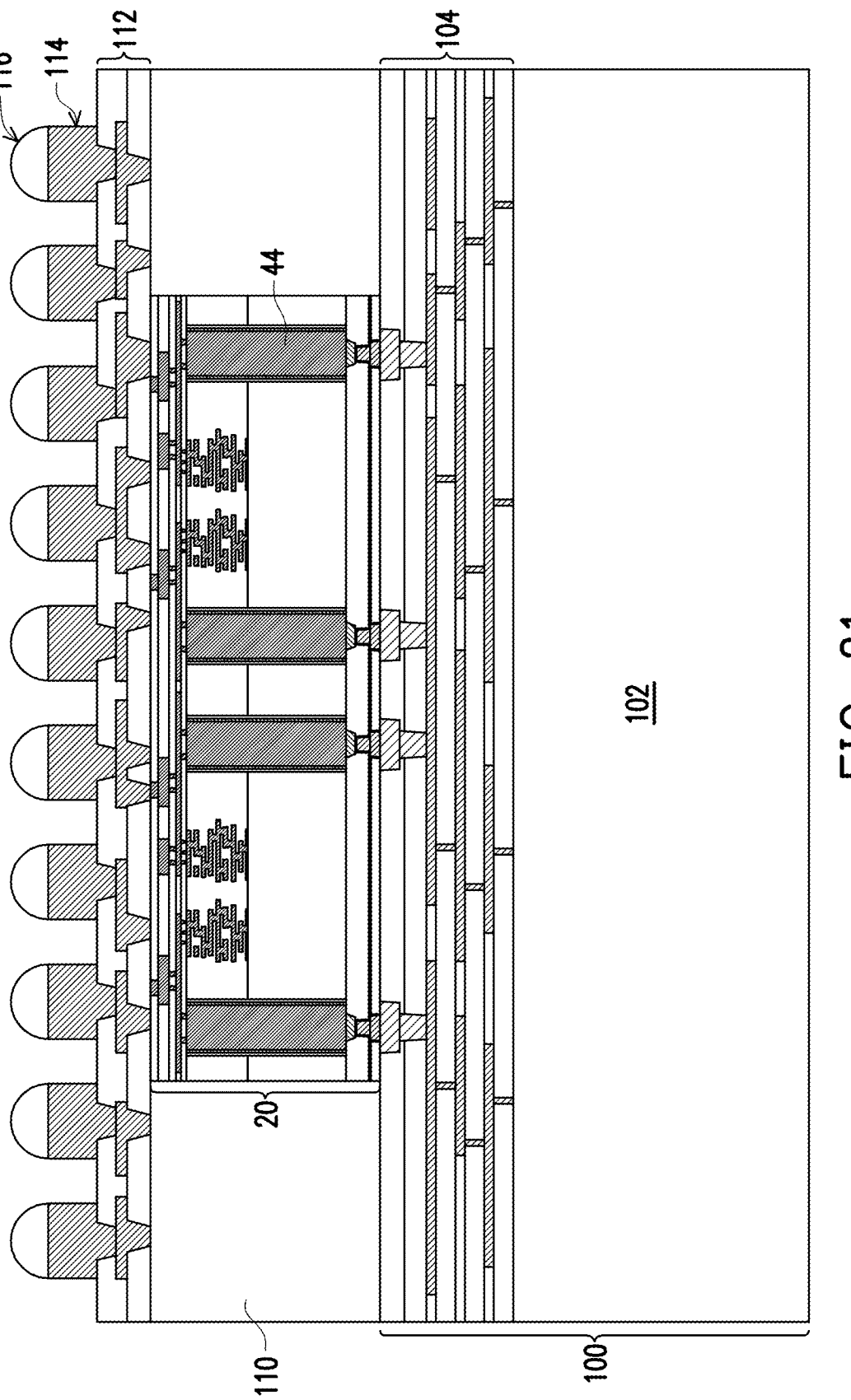
FIG. 21 illustrates a cross-sectional view of an intermediate stage in the formation of a package according to an embodiment.

The embodiment depicted in FIG. 20 is a chip-on-wafer structure bonded in a face-to-face configuration. Alternatively, the integrated circuit die 20 and the package structure 100 may be bonded in a face-to-back configuration, as shown in FIG. 21. For example, in FIG. 21, the back of the die 20 (e.g., exposed ends of the TSVs 44 and substrate 22) is bonded to the face of the package structure 100. Details regarding this embodiment that are similar to those for the previously described embodiment are not repeated herein.

Figure 22:
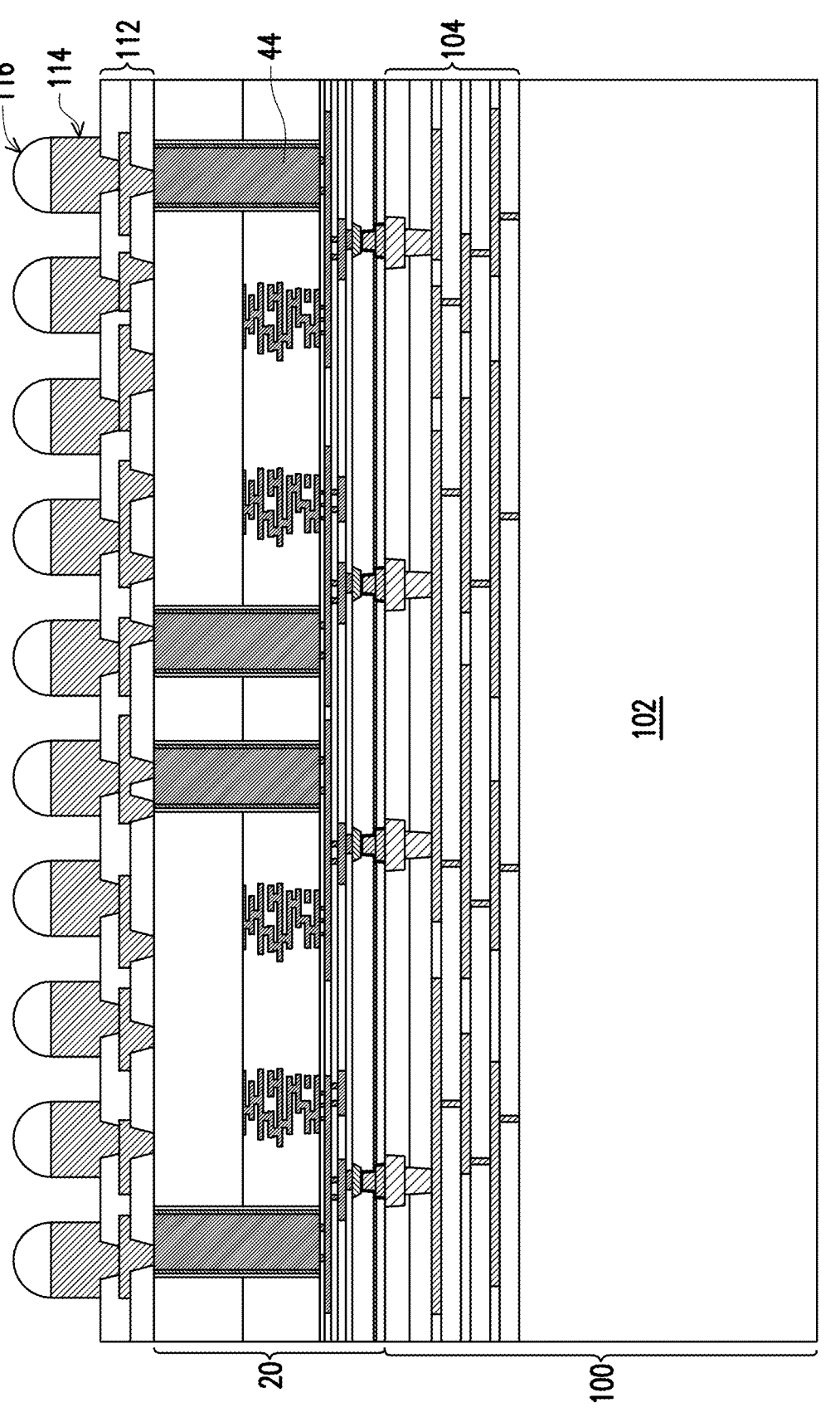
FIG. 22 illustrates a cross-sectional view of an intermediate stage in the formation of a package according to an embodiment.

FIG. 22 illustrates a cross-sectional view of a wafer-on-wafer structure in accordance with some embodiments. This embodiment is similar to the embodiment illustrated in FIGS. 1 through 19 except that this embodiment is a wafer-on-wafer structure instead of a chip-on-wafer structure. Details regarding this embodiment that are similar to those for the previously described embodiment will not be repeated herein.

In FIG. 22, the structure is a wafer-on-wafer structure bonded in a face-to-face configuration in which the upper structure is a wafer 20. The wafer 20 is formed similar to the die 20 described above and the description is not repeated herein. With this embodiment, the steps of singulating the die 20 and the formation of the encapsulant 110 in the previous embodiment are no longer needed and those steps can be omitted from this embodiment. In this embodiment, the wafer 20 and the package structure 100 are both wafers and are a same size.

In other embodiments, the wafer 20 may be bonded to the package structure 100 in a face-to-back configuration. For example, the back of the wafer 20 (e.g., exposed ends of the TSVs 44 and substrate 22) could be bonded to the face of the package structure 100.

Figure 23:
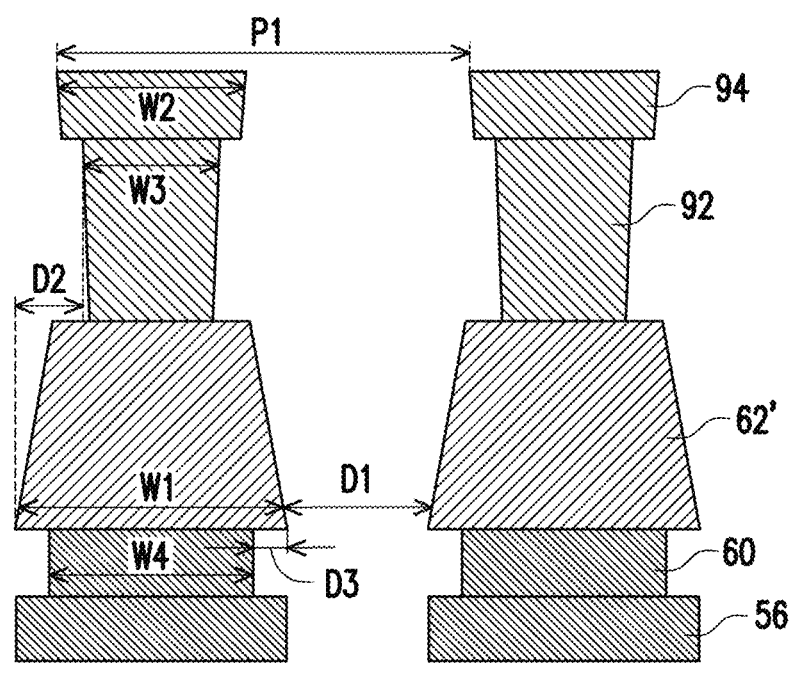
FIGS. 23, 24A, 24B, 25, and 26 illustrate cross-sectional and plan views of redistribution structures according to an embodiment.

FIGS. 23, 24A, 24B, 25, and 26 illustrate cross-sectional and a plan view of redistribution and bond pad structures in accordance with various embodiments. In FIG. 23, detailed views of adjacent redistribution and bond pad structures are illustrated without the passivation and dielectric layers. FIG. 23 includes top metals 56, redistribution vias 60, redistribution pads 62, bond pad vias 92, and bond pads 94. The redistribution vias 60 have a width W4. In some embodiments, the width W4 is as small as 0.7 μm. In some embodiments, the width W4 is in a range from 0.7 μm to 2.7 μm.

The adjacent redistribution and bond structures have a minimum spacing distance D1. In some embodiments, the distance D1 is as small as 1.2 μm. In some embodiments, the distance D1 is in a range from 1.2 μm to 1.8 μm. The sidewalls of the redistribution pad 62 and the overlaying bond pad via 92 are offset by a distance D2. In some embodiments, the distance D2 is as small as 0.1 μm. In some embodiments, the distance D2 is in a range from 0.1 μm to 0.7 μm. The sidewalls of the redistribution via 60 and the overlaying redistribution pad 62 are offset by a distance D3. In some embodiments, the distance D3 is as small as 0.1 μm. In some embodiments, the distance D3 is in a range from 0.1 μm to 0.5 μm.

Figures 24A, 24B:
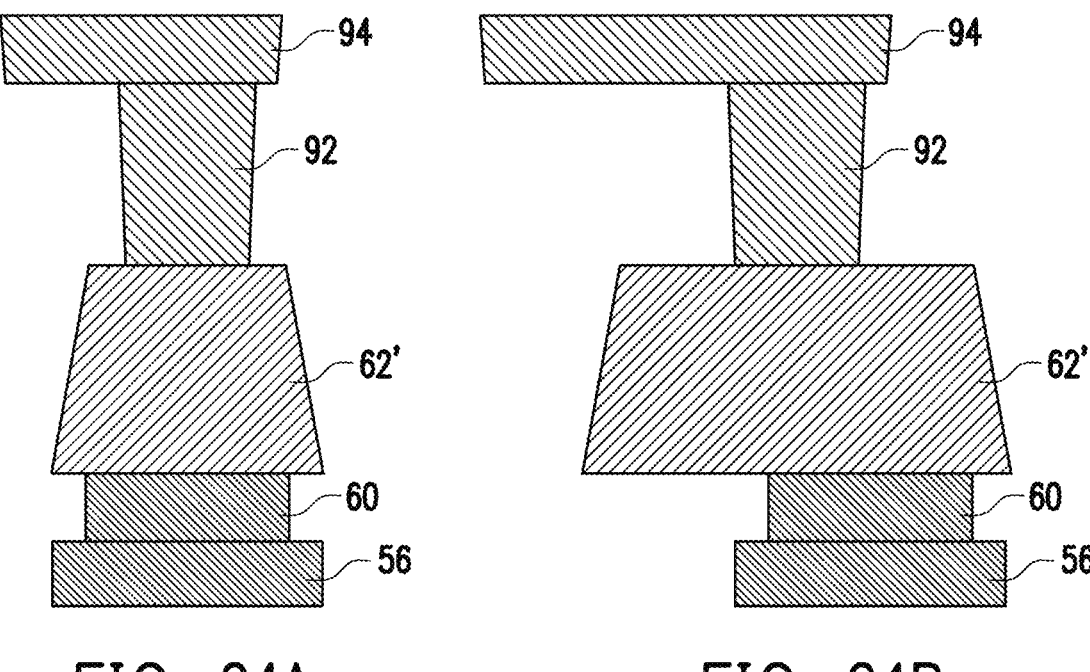

FIGS. 24A and 24B illustrate similar cross-sectional views as FIG. 23 and the description is not repeated herein. In FIG. 24A the bond pad via 92 and the bond pad 94 are partially overlapping the redistribution via 60 instead of each of them completely overlapping as illustrated in FIG. 23. In FIG. 24B the redistribution pad, the bond pad via 92, and the bond pad 94 are partially overlapping the redistribution via 60 instead of each of them completely overlapping as illustrated in FIG. 23.

Figure 25:
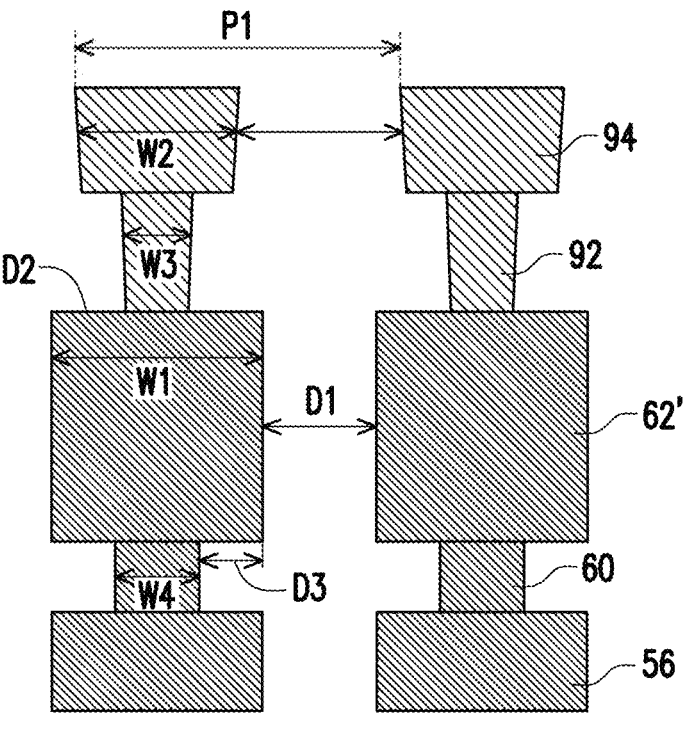
Figure 26:
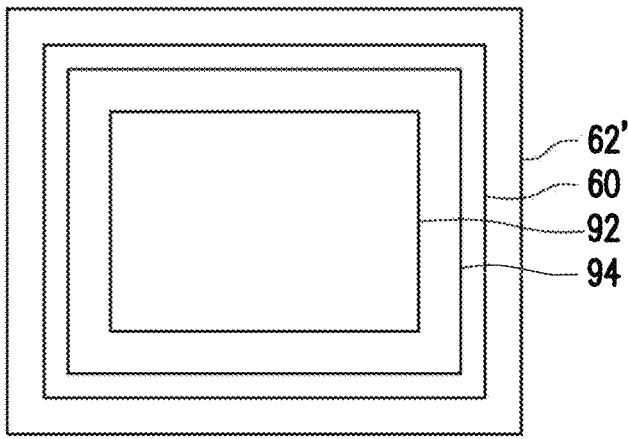

FIG. 25 illustrates a similar cross-sectional view as FIG. 23 and the description is not repeated herein. In FIG. 25, the redistribution pad 62 is formed by a damascene process. FIG. 26 illustrates a plan view of the redistribution via 60, redistribution pad 62, bond pad via 92, and bond pad 94. As illustrated, in some embodiments, the bond pad via 92 and bond pad 94 are completely overlapped with the redistribution via 60 and the redistribution pad 62.

FIGS. 27 through 32 illustrate cross-sectional views of intermediate stages in the formation of an integrated circuit die 20 in accordance with some embodiments. This embodiment is similar to embodiment in FIGS. 1 through 26. In this embodiment, the redistribution pad and redistribution via are formed at a same time by a same process and include a planarization step. Details regarding this embodiment that are similar to those for the previously described embodiment will not be repeated herein.

Figure 27:
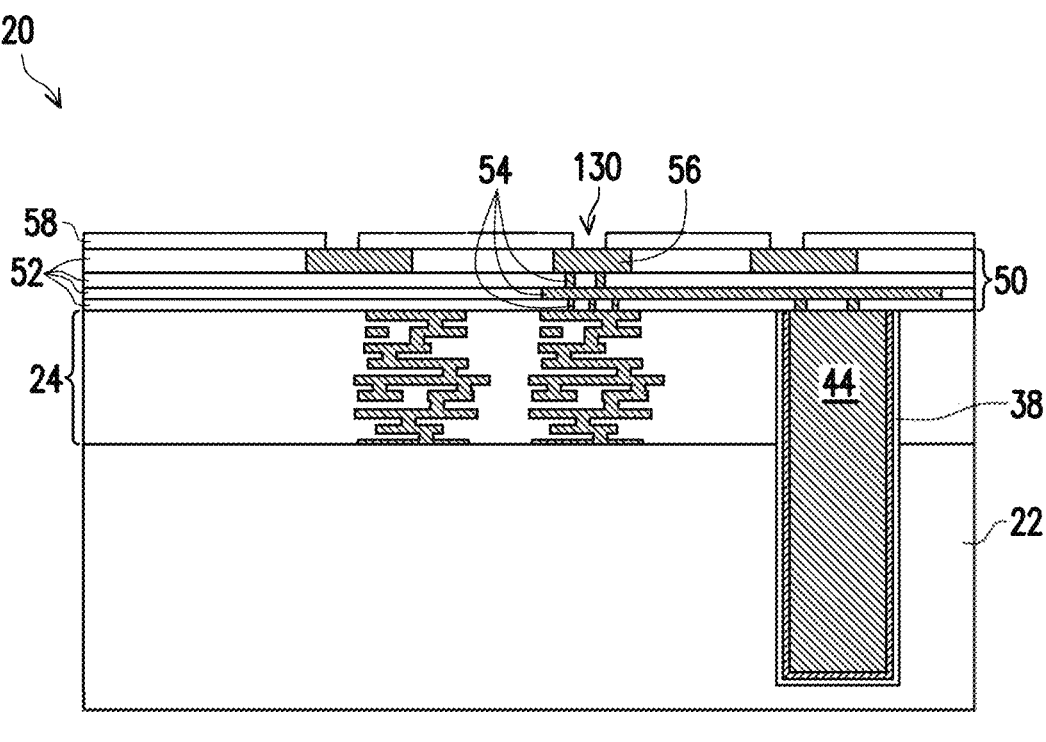
FIGS. 27 through 32 illustrate cross-sectional views of intermediate stages in the formation of a package according to an embodiment.

FIG. 27 is at a similar intermediate stage in the process as FIG. 7 and the description is not repeated herein. A difference between FIG. 27 and FIG. 7 is that the redistribution vias have not yet been formed in openings 130.

Figure 28:
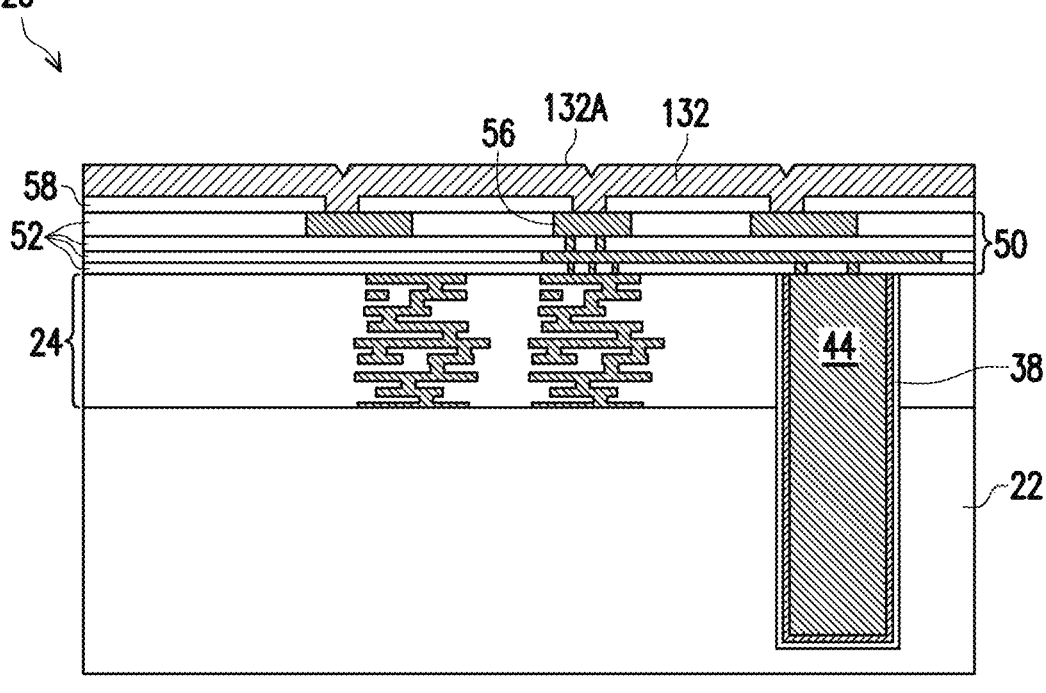

In FIG. 28, a redistribution pad layer 132 is formed over the passivation layer 58, in the openings 130, and on exposed portions of the top metal 56 in the openings 130. The redistribution pad layer 132 has a top surface 132A. In some embodiments, the redistribution pad layer 132 is formed by a conformal process and such that the top surface 132A follows the bottom surface of the layer. In some embodiments, the top surface 132A of the redistribution pad layer 132 is not flat and may have divots or low points over the openings 130. The materials and formation processes of the redistribution pad layer 132 is similar to the redistribution pad layer 62 described above and the description is not repeated herein.

Figure 29:
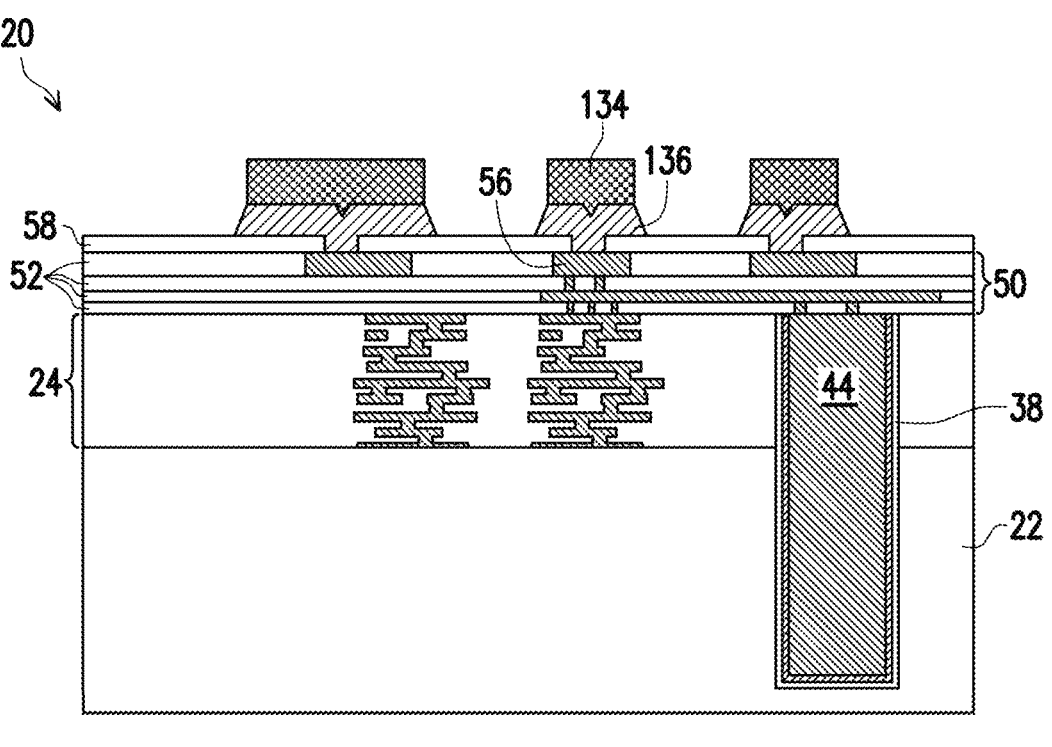

In FIG. 29, a photoresist 134 is formed and patterned over the redistribution pad layer 132. Further in FIG. 29, the patterned photoresist 134 is used as a mask to pattern the redistribution pad layer 132 to form redistribution pads 136. These steps are similar to the steps illustrated and described in FIGS. 9 and 10 above, and the descriptions are not repeated herein.

Figure 30:
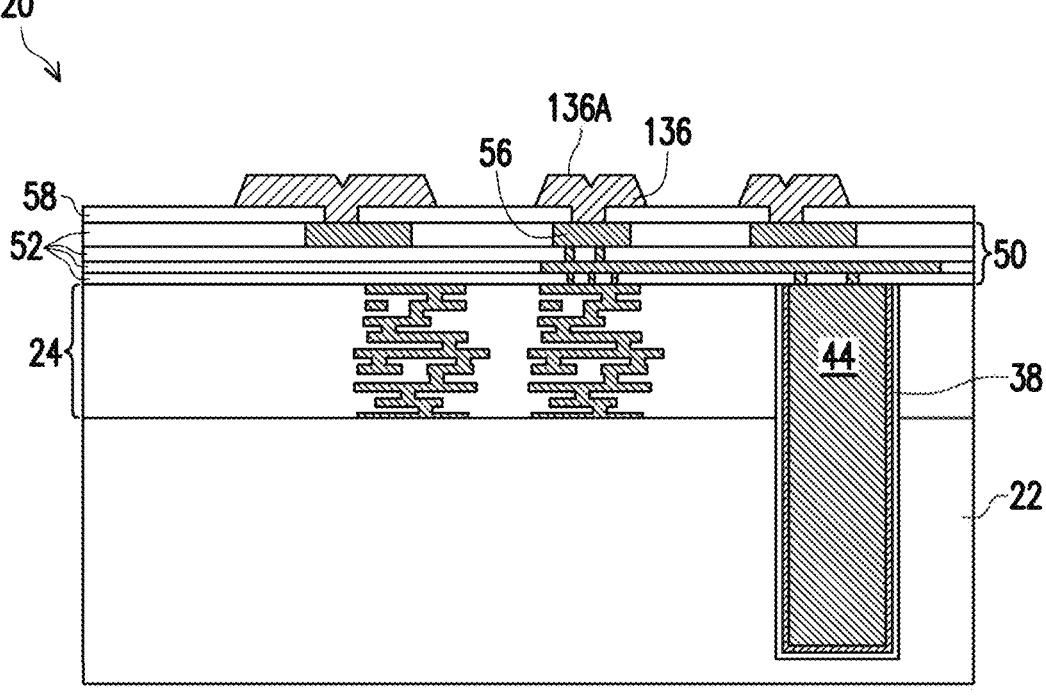
Figure 31:
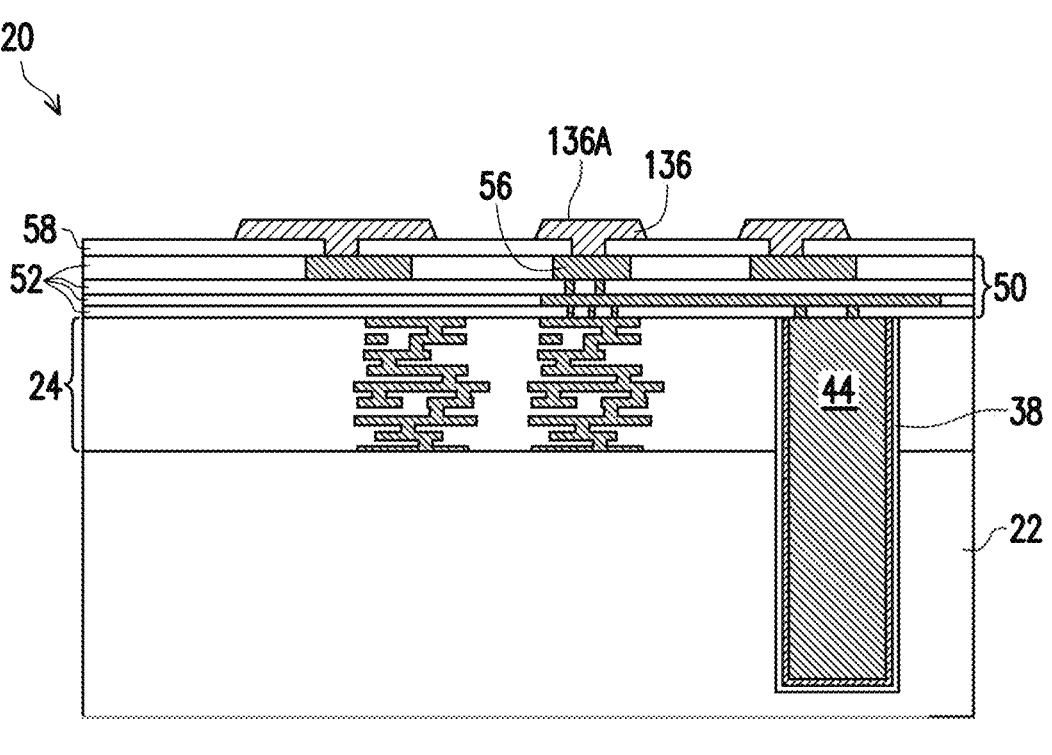

As illustrated in FIG. 30, the redistribution pad 136 has a top surface 136A that is not flat and may have divots or low points over the openings 130. In FIG. 31, a planarization process is performed on the top surfaces 136A of the redistribution pads 136 to provide flat top surfaces 136A for the redistribution pads 136. The planarization process may be, for example, a chemical-mechanical polish (CMP), a grinding process, or the like, and may reduce the thickness of the redistribution pad layer 136. By having the top surface 136A of the redistribution pad be a flat or level surface, bond vias and bond pads overlying the pad can be formed directly over the redistribution via and can have a minimum pitch reduced by at least 35%.

Figure 32:
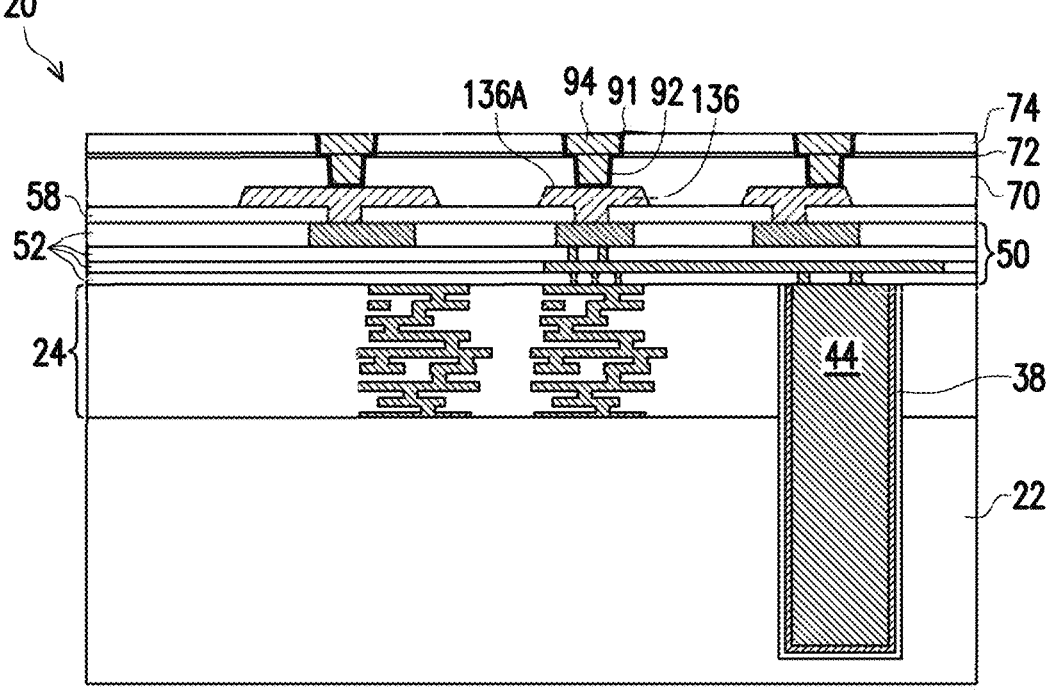

FIG. 32 illustrates subsequent processing on the structure of FIG. 31 and this processing is similar to that described and illustrated above in FIGS. 11 through 14 and the description is not repeated herein. The structure in FIG. 32 may undergo subsequent processing and be included in a package structure as described and illustrated above in FIGS. 17 through 22 and the description is not repeated herein.

FIGS. 33 through 38 illustrate cross-sectional views of intermediate stages in the formation of an integrated circuit die 20 in accordance with some embodiments. This embodiment is similar to embodiment in FIGS. 1 through 26. In this embodiment, the redistribution pad and redistribution via are formed at a same time by a same process. Further in this embodiment, the redistribution pad and redistribution via are formed by a dual damascene process. Details regarding this embodiment that are similar to those for the previously described embodiment will not be repeated herein.

Figures 33, 34:
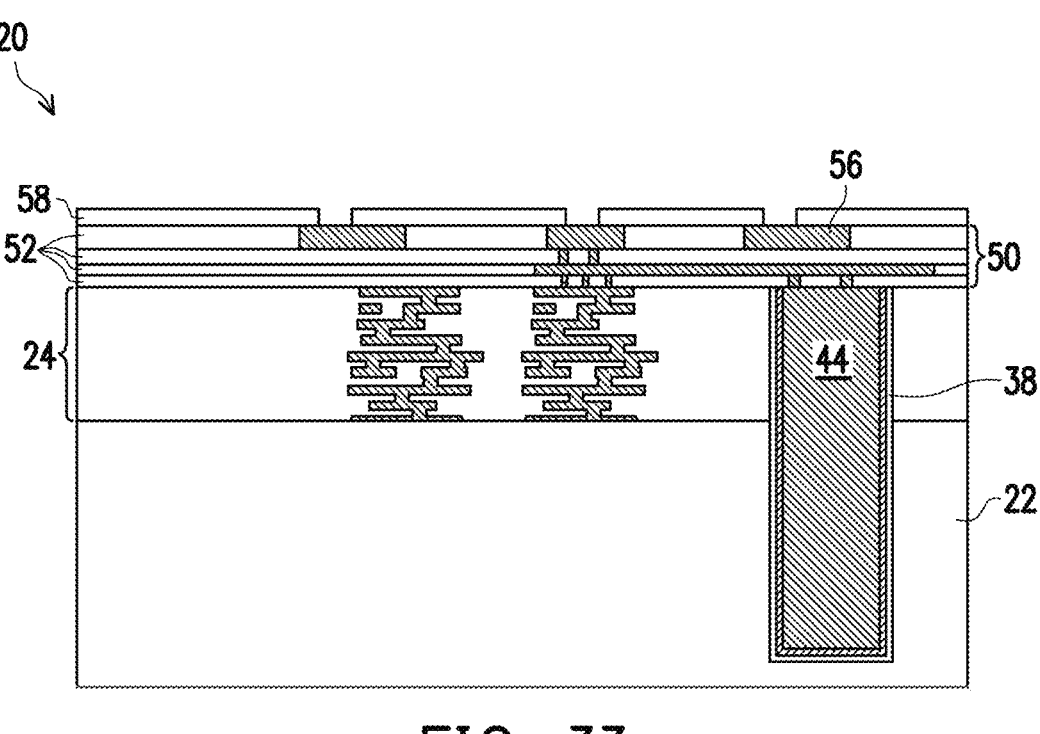
FIGS. 33 through 38 illustrate cross-sectional views of intermediate stages in the formation of a package according to an embodiment.

FIG. 33 is at a similar intermediate stage in the process as FIG. 7 and the description is not repeated herein. A difference between FIG. 33 and FIG. 7 is that the redistribution vias have not yet been formed in openings 130.

In FIG. 34, a seed layer 140 is formed over the passivation layer 58, in the openings 130, and on exposed portions of the top metal 56 in the openings 130. The materials and formation processes of the seed layer 140 is similar to the seed layer 40 described above and the description is not repeated herein.

Figure 35:
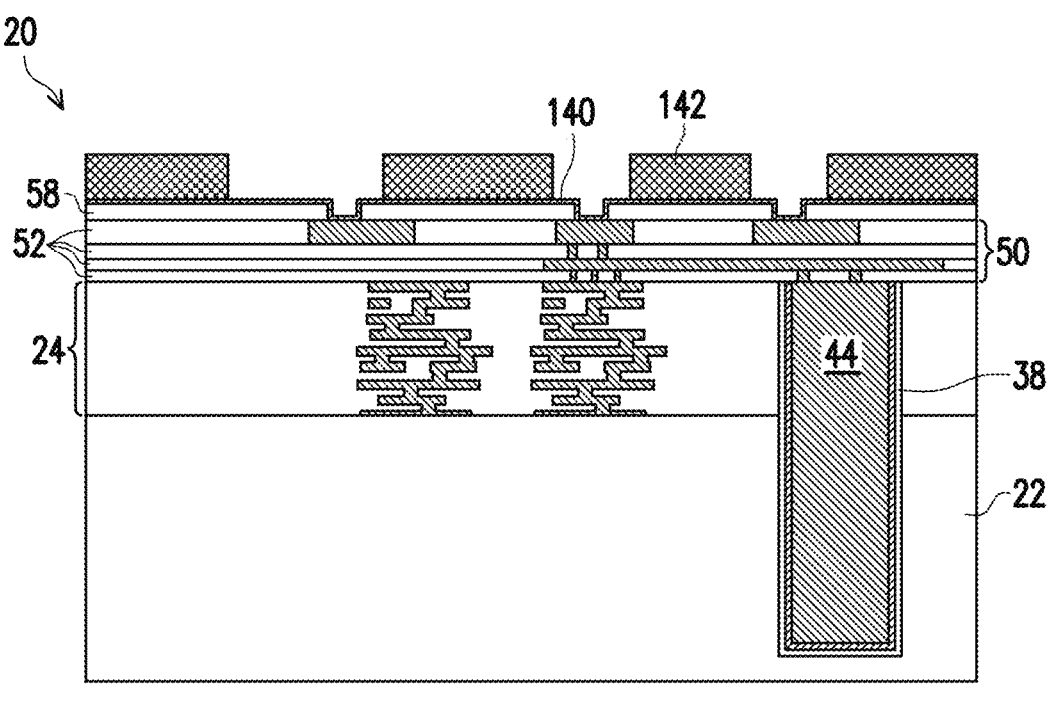

In FIG. 35, a photoresist 142 is formed and patterned over the seed layer 140. These steps are similar to the steps illustrated and described above, and the descriptions are not repeated herein.

Figure 36:
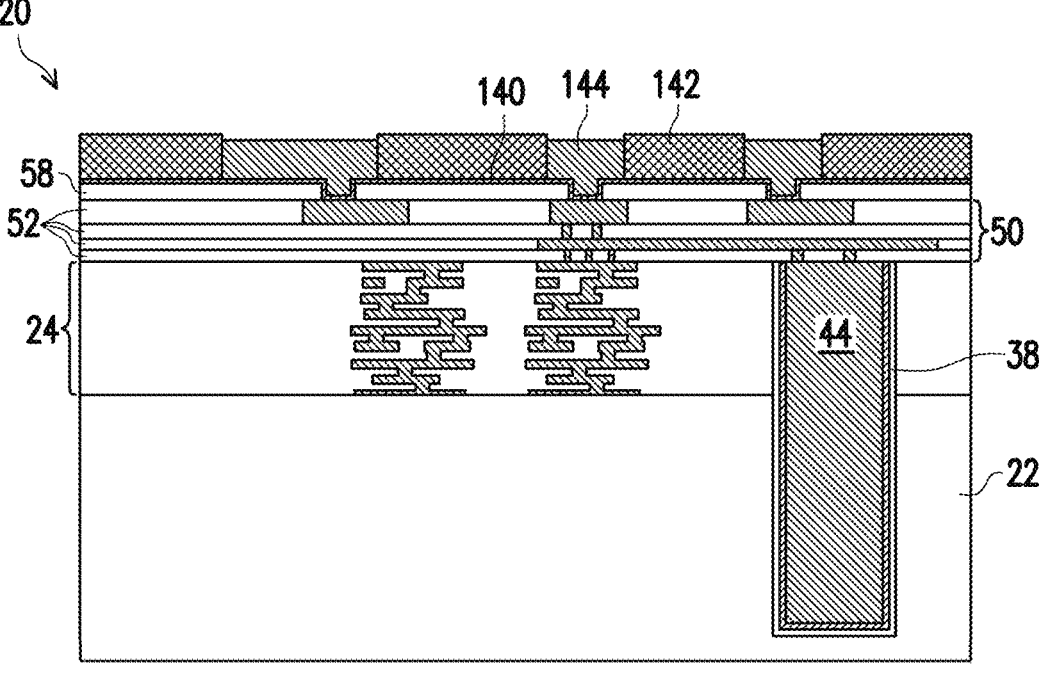

In FIG. 36, a conductive material 144 is formed on the exposed seed layer 140 in the openings of the photoresist 142. The materials and formation processes of the conductive material 144 is similar to the conductive material 42 described above and the description is not repeated herein.

Figure 37:
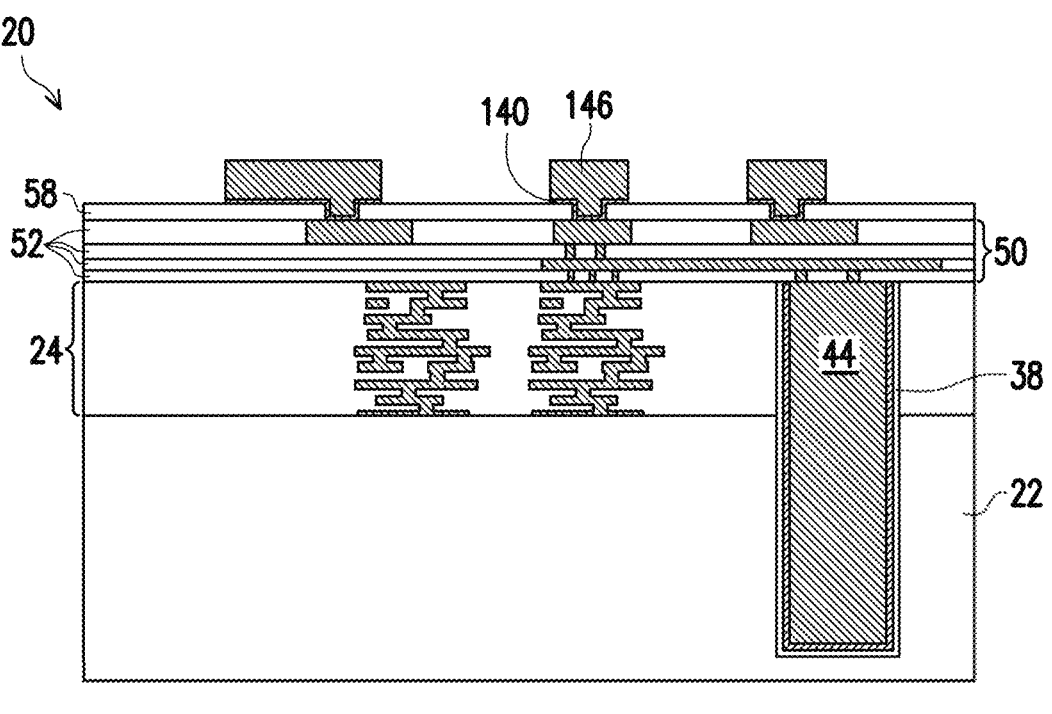

In FIG. 37, the photoresist 142 and underlying portion of the seed layer 140 are removed to form the redistribution pads 146. The photoresist 142 may be removed by an acceptable ashing or stripping process, such as using an oxygen plasma or the like. The portions of the seed layer 140 may be removed by an acceptable etching process. By having the top surface of the redistribution pad 146 with a flat or level surface, bond vias and bond pads overlying the pad can be formed directly over the redistribution via and can have a minimum pitch reduced by at least 35%.

Figure 38:
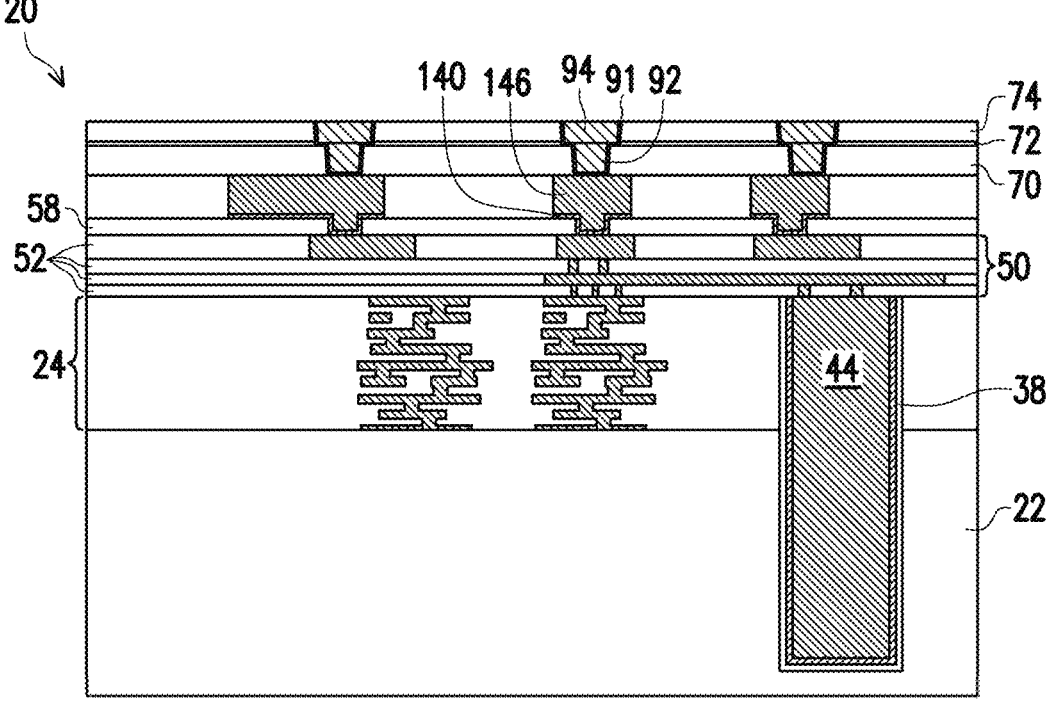

FIG. 38 illustrates subsequent processing on the structure of FIG. 37 and this processing is similar to that described and illustrated above in FIGS. 11 through 14 and the description is not repeated herein. The structure in FIG. 38 may undergo subsequent processing and be included in a package structure as described and illustrated above in FIGS. 17 through 22 and the description is not repeated herein.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or the 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve advantages. Embodiments discussed herein may be discussed in a specific context, namely a redistribution structure that can be integrated into a device (e.g., a chip or die) or a package (e.g., a chip-on-wafer (CoW) package structure or a wafer-on-wafer (WoW) package structure). The redistribution structure includes a redistribution via with a level or flat upper surface with an overlying pad to allow for a smaller pitch and minimum distance between adjacent redistribution vias and overlying pads. In some embodiments, the redistribution via is formed separately from the overlying pad using, for example, a single damascene process. In some embodiments, the redistribution via is formed in a same process as the overlying pad using, for example, a dual damascene process followed by a planarization process to level or flatten the upper surface of the overlying pad. By having the top surface of the redistribution via and/or the top surface of the overlaying pad be a flat or level surface, bond vias and bond pads overlying the pad can be formed directly over the redistribution via and can have a minimum pitch reduced by at least 35%.

An embodiment includes a method including forming a first interconnect structure over a first substrate, the first interconnect structure including dielectric layers and metallization patterns therein. The method also includes forming a redistribution via over the first interconnect structure, the redistribution via being electrically coupled to at least one of the metallization patterns of the first interconnect structure. The method also includes forming a redistribution pad over the redistribution via, the redistribution pad being electrically coupled to the redistribution via. The method also includes forming a first dielectric layer over the redistribution pad. The method also includes forming a second dielectric layer over the first dielectric layer. The method also includes patterning the first and second dielectric layers. The method also includes forming a bond via over the redistribution pad and in the first dielectric layer, the bonding via being electrically coupled to the redistribution pad, the bond via overlapping the redistribution via. The method also includes forming a first bond pad over the bonding via and in the second dielectric layer, the first bond pad being electrically coupled to the bond via.

Embodiments may include one or more of the following features. The method where the redistribution via and the redistribution pad are each formed in a damascene process. The redistribution via and the redistribution pad are formed by a single deposition process. A top surface of the redistribution pad is flat across an entirety of the top surface. Forming the redistribution pad over the redistribution via further includes depositing a conductive material, and performing a planarization process on a top surface of the conductive material to form the redistribution pad with a flat top surface. The redistribution pad has a different material composition than the redistribution via. The first bond pad overlaps the redistribution via. The method further including patterning the first interconnect structure to form a first opening exposing a portion of the first substrate, depositing a liner in the first opening, filling the first opening with a conductive material, and thinning the first substrate to expose a portion of the conductive material in the first opening, the conductive material extending through the first interconnect structure and the first substrate forming a through substrate via. The method further including hybrid bonding the second dielectric layer and the first bond pad to a third dielectric layer and a second bond pad of a package structure, the package structure including a second substrate and a second interconnect structure over the second substrate, the third dielectric layer and the second bond pad being part of the second interconnect structure. The method further including after hybrid bonding the second dielectric layer and the first bond pad to the third dielectric layer and the second bond pad of the package structure, forming a first redistribution structure over the first substrate, the first redistribution structure including dielectric layers and metallization patterns therein, the metallization patterns of the first redistribution structure being electrically coupled to the through substrate via, and forming a first set of conductive bumps over and electrically coupled to the first redistribution structure. The method further including before forming the first redistribution structure, encapsulating the first substrate, the first interconnect structure, the first dielectric layer, and the second dielectric layer with an encapsulant, the first redistribution structure being formed over the encapsulant.

An embodiment includes a method including forming a first dielectric layer over a first substrate, the first dielectric layer having a first metallization pattern therein. The method also includes forming a first via in a second dielectric layer over the first dielectric layer, the first via being electrically coupled to the first metallization pattern. The method also includes forming a conductive pad over the first via and the second dielectric layer, the conductive pad being electrically coupled to the first via. The method also includes forming a bond via in a third dielectric layer over the conductive pad and the second dielectric layer, the bond via being electrically coupled to the conductive pad, the bond via overlapping the first via. The method also includes forming a first bond pad in a fourth dielectric layer over the bond via and the third dielectric layer, the first bond pad being electrically coupled to the bond via, the first bond pad overlapping the first via.

Embodiments may include one or more of the following features. The method further including performing a damascene process to form the first via in the second dielectric layer, depositing a first conductive material over the first via and the second dielectric layer, forming a mask over the first conductive material, and patterning the first conductive material using the mask to form the conductive pad over the first via. The first via and the conductive pad are formed by a single deposition process. Before the planarization process, the conductive pad has a non-planar top surface. The method further including forming a first patterned mask over the first dielectric layer, performing an etch process using the first patterned mask as a mask, the etch process forming a first opening through the first dielectric layer and partially through the first substrate, forming a liner in the first opening, filling the first opening with a conductive material, and thinning the first substrate to expose a portion of the conductive material in the first opening, the conductive material extending through the first dielectric layer and the first substrate forming a through substrate via. The method further including hybrid bonding the fourth dielectric layer and the first bond pad to a fifth dielectric layer and a second bond pad of a package structure, the package structure including a second substrate.

An embodiment includes a structure including a first interconnect structure over a first substrate, the first interconnect structure including dielectric layers and metallization patterns therein. The structure also includes a through substrate via extending through the first interconnect structure and the first substrate. The structure also includes a redistribution via over the first interconnect structure, the redistribution via being electrically coupled to at least one of the metallization patterns of the first interconnect structure. The structure also includes a redistribution pad over the redistribution via, the redistribution pad being electrically coupled to the redistribution via. The structure also includes a bond via over the redistribution pad, the bonding via being electrically coupled to the redistribution pad, the bond via overlapping the redistribution via. The structure also includes a first bond pad over the bonding via, the first bond pad being electrically coupled to the bond via, the first bond pad overlapping the redistribution via.

Embodiments may include one or more of the following features. The structure where a top surface of the redistribution pad is flat across an entirety of the top surface. The redistribution via and the redistribution pad are a continuous conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first interconnect structure over a first substrate, the first interconnect structure comprising dielectric layers and metallization patterns therein;
   forming a redistribution via over the first interconnect structure, the redistribution via being electrically coupled to at least one of the metallization patterns of the first interconnect structure;
   forming a redistribution pad over the redistribution via, the redistribution pad being electrically coupled to the redistribution via, wherein forming the redistribution pad over the redistribution via further comprises:
   depositing a first conductive material; and
   performing a planarization process on a top surface of the first conductive material to form the redistribution pad with a flat top surface;
   forming a first dielectric layer over the redistribution pad;
   forming a second dielectric layer over the first dielectric layer;
   patterning the first and second dielectric layers;
   forming a bond via over the redistribution pad and in the first dielectric layer, the bonding via being electrically coupled to the redistribution pad, the bond via overlapping the redistribution via; and
   forming a first bond pad over the bonding via and in the second dielectric layer, the first bond pad being electrically coupled to the bond via.

2. The method of claim 1, wherein the redistribution via and the redistribution pad are each formed in a damascene process.

3. The method of claim 1, wherein the redistribution via and the redistribution pad are formed by a single deposition process.

4. The method of claim 1, wherein the flat top surface of the redistribution pad is flat across an entirety of the top surface.

5. The method of claim 1, wherein the first bond pad overlaps the redistribution via.

6. The method of claim 1 further comprising
   patterning the first interconnect structure to form a first opening exposing a portion of the first substrate;
   depositing a liner in the first opening;
   filling the first opening with a second conductive material; and
   thinning the first substrate to expose a portion of the second conductive material in the first opening, the second conductive material extending through the first interconnect structure and the first substrate forming a through substrate via.

7. The method of claim 6 further comprising:
   hybrid bonding the second dielectric layer and the first bond pad to a third dielectric layer and a second bond pad of a package structure, the package structure comprising a second substrate and a second interconnect structure over the second substrate, the third dielectric layer and the second bond pad being part of the second interconnect structure.

8. The method of claim 7 further comprising after hybrid bonding the second dielectric layer and the first bond pad to the third dielectric layer and the second bond pad of the package structure, forming a first redistribution structure over the first substrate, the first redistribution structure comprising dielectric layers and metallization patterns therein, the metallization patterns of the first redistribution structure being electrically coupled to the through substrate via; and forming a first set of conductive bumps over and electrically coupled to the first redistribution structure.

9. The method of claim 8 further comprising:

before forming the first redistribution structure, encapsulating the first substrate, the first interconnect structure, the first dielectric layer, and the second dielectric layer with an encapsulant, the first redistribution structure being formed over the encapsulant.

10. The method of claim 1, wherein the redistribution via and the redistribution pad are a continuous conductive structure.

11. The method of claim 1, wherein the bond via has a width smaller than a width of the redistribution pad, and the first bond pad has a width smaller than the width of the redistribution pad.

12. The method of claim 1, wherein adjacent bond pads have a pitch in a range from 3.0 μm to 5.4 μm.

13. The method of claim 1, further comprising forming a barrier layer in the first dielectric layer before forming the bond via, wherein the barrier layer comprises titanium, titanium nitride, or a combination thereof.

14. A method comprising:

forming a first dielectric layer over a first substrate, the first dielectric layer having a first metallization pattern therein;

forming a first via in a second dielectric layer over the first dielectric layer, the first via being electrically coupled to the first metallization pattern;

forming a conductive pad over the first via and the second dielectric layer, the conductive pad being electrically coupled to the first via, wherein the first via and the conductive pad are formed by a single deposition process;

forming a bond via in a third dielectric layer over the conductive pad and the second dielectric layer, the bond via being electrically coupled to the conductive pad, the bond via overlapping the first via; and forming a first bond pad in a fourth dielectric layer over the bond via and the third dielectric layer, the first bond pad being electrically coupled to the bond via, the first bond pad overlapping the first via.

15. The method of claim 14 further comprising:

after the single deposition process, performing a planarization process on the conductive pad to form a conductive pad with a planar top surface, wherein before the planarization process, the conductive pad has a non-planar top surface.

16. The method of claim 14 further comprising:

forming a first patterned mask over the first dielectric layer;

performing an etch process using the first patterned mask as a mask, the etch process forming a first opening through the first dielectric layer and partially through the first substrate;

forming a liner in the first opening;

filling the first opening with a conductive material; and thinning the first substrate to expose a portion of the conductive material in the first opening, the conductive material extending through the first dielectric layer and the first substrate forming a through substrate via.

17. The method of claim 14 further comprising:

hybrid bonding the fourth dielectric layer and the first bond pad to a fifth dielectric layer and a second bond pad of a package structure, the package structure comprising a second substrate.

18. A method comprising:

forming a first interconnect structure over a first substrate, the first interconnect structure comprising dielectric layers and metallization patterns therein, a through substrate via extending through the first interconnect structure and at least partially through the first substrate;

forming a redistribution via over the first interconnect structure, the redistribution via being electrically coupled to at least one of the metallization patterns of the first interconnect structure, the redistribution via being electrically coupled to the through substrate via;

forming a redistribution pad over the redistribution via, the redistribution pad being electrically coupled to the redistribution via;

forming a bond via over the redistribution pad, the bonding via being electrically coupled to the redistribution pad, the bond via overlapping the redistribution via; and forming a first bond pad over the bonding via, the first bond pad being electrically coupled to the bond via, the first bond pad overlapping the redistribution via.

19. The method of claim 18, wherein a top surface of the redistribution pad is flat across an entirety of the top surface.

20. The method of claim 18, wherein the redistribution via and the redistribution pad are a continuous conductive structure.

\* \* \* \* \*